(12) United States Patent
Watkins et al.

(10) Patent No.: US 7,419,772 B2
(45) Date of Patent: Sep. 2, 2008

(54) MESOPOROUS MATERIALS AND METHODS

(75) Inventors: James J. Watkins, South Hadley, MA (US); Rajaram Pai, Amherst, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 10/301,013

(22) Filed: Nov. 21, 2002

(65) Prior Publication Data

US 2003/0157248 A1 Aug. 21, 2003

Related U.S. Application Data

(60) Provisional application No. 60/332,625, filed on Nov. 21, 2001.

(51) Int. Cl.
G03F 7/16 (2006.01)
G03F 7/36 (2006.01)
G03F 7/26 (2006.01)

(52) U.S. Cl. .................. 430/325; 264/628; 264/414; 264/425; 430/272.1; 430/270.1

(58) Field of Classification Search ............... 423/701; 264/414, 425
See application file for complete search history.

(56) References Cited

U.S. PATENT DOCUMENTS

| | | | |
|---|---|---|---|
| 4,552,786 A | 11/1985 | Berneburg et al. | |
| 4,582,731 A | 4/1986 | Smith | |
| 4,734,227 A | 3/1988 | Smith | |
| 4,737,384 A | 4/1988 | Murthy et al. | |
| 4,970,093 A | 11/1990 | Sievers et al. | |
| 5,246,895 A | 9/1993 | Lesher et al. | |
| 5,296,417 A | 3/1994 | Claar et al. | |
| 5,403,621 A | 4/1995 | Jackson et al. | |
| 5,407,740 A | 4/1995 | Jessen | |
| 5,622,684 A | 4/1997 | Pinnavaia et al. | |
| 5,686,031 A | 11/1997 | Coronado et al. | 264/40.1 |
| 5,785,946 A | 7/1998 | Pinnavaia et al. | 423/701 |
| 5,789,027 A | 8/1998 | Watkins et al. | |
| 5,858,457 A | 1/1999 | Brinker et al. | 427/162 |
| 5,922,299 A | 7/1999 | Bruinsma et al. | 423/335 |
| 5,948,470 A * | 9/1999 | Harrison et al. | 427/198 |
| 6,306,348 B1 | 10/2001 | Havens et al. | |
| 6,680,013 B1 * | 1/2004 | Stein et al. | 264/44 |
| 2002/0127498 A1 | 9/2002 | Doshi et al. | |
| 2002/0143073 A1 | 10/2002 | Jiang et al. | |

FOREIGN PATENT DOCUMENTS

| | | |
|---|---|---|
| EP | 0 881 673 A2 | 12/1998 |
| JP | 06-32675 A * | 2/1994 |
| WO | WO-97/44293 A * | 11/1997 |

OTHER PUBLICATIONS

Chan et al, "Ordered Bicontinuous Nanoporous and Nanorelief Ceramic Flims from Self Assembling Polymer Precursors", Science, vol. 286, pp. 1716-1719 published Nov. 26, 1999, www.sciencemag.org.*
Spatz et al "Ultrathin Diblock Copolymer/Titanium Laminates—A Tool for Nanolithography", Advanced Materials, 1998, vol. 10, No. 11, pp. 849-852.*
Dapkus, et al "Dense arrays of ordered GaAs nanostructures by selective area growth on substrates patterned by block copolymer lithography", Applied Physics Letters, vol. 76, No. 13, pp. 1689-1691.*
Kim, et al "Epitaxial self-assembly of block copolymers on lithographically defined nanopatterned substrates", Nature, vol. 424, Jul. 24, 2003 pp. 411-414.*
Balsara et al "Block copolymers in Nanotechnology" pp. 317-327, from Chemistry of nanostructured Materials, Wordl Scientific, pub date 2003, edited by Yang, Piedong found on Knovel website.*
Amundson et al "Effect of an Electric Field on Bock Copolymer microstructure", Macromolecues, 1991 vol. 24, pp. 6546-6548.*
Yang et al "Block Copolymer Templating Syntheses Mesoporous Metal Oxides with Large Ordering Lenths and Semicrystalline Framework", Chem. Mater. 1999, vol. 11, pp. 2813-2826.*
Sankaran et al "Synthesis of Zinc Sulfide CLusters and Zinc Particles within Microphase-Separated Domains of Organiometallic Block Copolymers", Chem Mater., 1993, pp. 1133-1142.*
"Chemistry—Solutions" cited by www.geocities.com/proofpurchase/web?200619 printed out Nov. 19, 2006 as two pages citing to Dorin, Henry. Chemistry the Stucd of Matter, Massachusetts: Cebco, 1987 pp. 334-336 of Dorin.*
xreferplus—solution (chemistry) from http:www.xreferplus.com/entry/1110205 cited from the Hutchison Encyclopedia, Helicon Publishing Limited, 2001, one page.*
English translation of JP 06-032675, A (Feb. 1994) from machine translation from AIPN Japan Patent Office National center for Industrial Property Information and Training, generated Sep. 13, 2007, 11 pages.*
Pat-No. JP406032675A, English abstract of JP 06-032675 A, first inventor Masuda, one page, copyright 1994, JPO&Japio printed ouy on Sep. 13, 2007 in East databese USPTO.*
Derwent-Acc-No: 1994-103835 English abstract of JP 06032675 A, publication date Feb. 8, 1994, Patent-assignee NE Chemcat Corp[Nechn], 3 Pages Printed out on Sep. 13, 2007 from East database of USPTO.*
Johnson et al, Chem. Mater. 1997 (no month given) vol. 9, pp. 2448-2458.*
Yang et al., "Free-standing mesoporous silica films; morphogenesis of channel and surface patterns", J. Mater. Chem. 7(9):1755-1761 (1997).
PCT International Search Report mailed Mar. 17, 2004.
Bocquet et al., "A New $TiO_2$ Film Deposition Process in a Supercritical Fluid, Surface and Coatings Technology," 70:73-78, 1994.
Hampden-Smith et al., "Chemical Vapor Deposition of Metals: Part 1. An Overview of CVD Processes," Chem. Vap. Deposition, 1:8-23, 1995.
Hansen et al., "Supercritical Fluid Transport-Chemical Depositon of Films," Chem Mater., 4:749-752, 1992.

(Continued)

*Primary Examiner*—Cynthia Hamilton
(74) *Attorney, Agent, or Firm*—Fish & Richardson P.C.

(57) ABSTRACT

Mesoporous articles and methods for making mesoporous articles are disclosed.

46 Claims, 16 Drawing Sheets

OTHER PUBLICATIONS

Hybertson et al., "Deposition of Palladium Films by a Novel supercritical Fluid Transport Chemical Deposition Process," Mat. Res. Bull., 26:1127-1133, 1991.

Louchev et al., "The Morphological Stability in Supercritical Fluid Chemical Deposition of Films Near the Criticial Point," Journal of Crystal Growth, 155:276-285, 1995.

Loy, Douglas A., "Direct Formation of . . . ," Chem. Mater, 9:2264-2268, 1997.

Melosh, N.A., "Molecular and Mesoscopic . . . ," Macromolecules, 32:4332-4342, 1999, published on web Jun. 11, 1999.

Wakayama, H., "Nanoporous Metal Oxides . . . ," Chem. Mater, 13:2391-2396, 2001, Jun. 9, 2001 pub date.

Wakayama, H., "Nanoporous Silica Prepared . . . ," Chem. Mater, 12:756-761, 2000.

Watkins et al., "Polymer/Metal Nanocomposite Synthesis in Supercritical $CO_2$", Chemistry of Materials, 7:11, 1995.

European Search Report mailed Feb. 18, 2005.

Wakayama, H., "Nanoporous Silica Prepared . . . ," Chem. Mater, 12:756-761, 2000.

Watkins et al., "Polymer/Metal Nanocomposite Synthesis in Supercritical $CO_2$", Chemistry of Materials, 7:11, 1995.

Bryan D. Vogt, "Characterization of Ordered Mesoporous Silica Films Using Small-Angle Neutron Scattering and X-ray Porosimetry", Chem. Mater. 2005, 17, 1398-1408, pub. date Feb. 3, 2005.

P. I. Ravikovitch, "Capillary Hysteresis in Nanopores: Theoretical and Experimental Studies of Nitrogen Adsorption on MCM-41", Langmuir 1995, 11, 4765-4772, no month given.

M.R. Baklanov, "Non-destructive characterisation of porous low-k dielectric films", Microelectronic Engineering 64 (2002) 335-349, no month given.

Barry J. Bauer, "Structure and Property Characterization of Low-k Dielectric Porous Thin Films", 3 Journal of Electronic Materials, vol. 30, No. 4, 2001, Apr. 2001 date.

Pascal Van Der Voort, "Rationalization of the Synthesis of SBA-16: Controlling the Micro- and Mesoporosity", J. Phys. Chem. B 2002, 106, 9027-9032, pub date: Aug. 9, 2002.

Bernd Smarsly, "SANS Investigation of Nitrogen Sorption in Porous Silica", J. Phys. Chem. B 2001, 105, 831-840 pub.date on web Jan. 4, 2001.

John F. Anker, "Subsurface profile refinement for neutron specular reflectivity, National Institute of Standards and Technology Reactor Radiation Division", Gaithersburg, MD 20899, 1992 no month.

G. J. A. A. Soler-Illia, "Structural control in self-standing mesostructured silica oriented membranes and xerogels", Received (in Cambridge, UK) Aug. 6, 2002, Accepted Sep. 3, 2002 First published as an Advance Article on the web Sep. 19, 2002.

Tianbo Liu, "Polymer-Assisted Formation of Giant Polyoxomolybdate Structures", J. Am. Chem. Soc. 2001, 123, 10966-10972, pub date on web: Oct. 11, 2001.

Jun Liu, "Direct Observation of Nanorange Ordered Microporosity within Mesoporous Molecular Sieves", Chem. Mater. 2002, 14, 2536-2540, pub date on web: Apr. 19, 2002.

V. A. Gilchrist, "Adsorption of Penta (ethylene glycol) Monododecyl Ether at the Solid Poly (Methyl methacrylate)-Water Interface": A Spectroscopic Ellipsometry Study, Langmuir 2000, 16, 740-748, pub date on web: Nov. 20, 1999.

P. Debye, "Scattering by an Inhomogeneous Solid. II. The Correlation Function and Its Application", Journal of Applied Physics, vol. 28, No. 6, Jun. 1957.

Elliott P. Barrett, "The Determination of Pore Volume and Area Distributions in Porous Substances. I. Computations from Nitrogen Isotherms", Jan. 1951, vol. 73.

Mark E. Davis, "A Molecular sieve with eighteen-membered rings", Nature vol. 331, Feb. 25, 1988.

Dongyuan Zhao, et al., "Triblock Copolymer Syntheses of Mesoporous Silica with Periodic 50 to 300 Angstrom Pores", Science 279, 548 (1998); DOI: 10.1126/science.279.5350.548, January.

C. Jeffrey Brinker, "Evaporation-Induced Self-Assembly: Nanostructures Made Easy", Adv. Mater. 1999, 11, No. 7, no month given.

Ralf Schmidt, "Pore Size Determination of MCM-41 Mesoporous Materials by means of 'H NMR Spectroscopy", N2 adsorption, and HREM. A Preliminary Study, J. Am. Chem. Soc. 1995, 117, 4049-4056, no month given.

Mark E. Davis, "Ordered porous materials for emerging applications", Chemical Engineering, California Institute of Technology, Pasadena, California 91125, USA Jun. 20, 2002.

Anne Galarneau, "True Microporosity and Surface Area of Mesoporous SBA-15 Silicas as a Function of Synthesis Temperature", Langmuir 2001, 17, 8328-8335, pub date Nov. 21, 2001.

T. L. Dull, "Determination of Pore Size in Mesoporous Thin Films from the Annihilation Lifetime of Positronium", J. Phys. Chem. B 2001, 105, 4657-4662, pub date Apr. 28, 2001.

Wayne W. Lukens, Jr., "Evaluating Pore Sizes in Mesoporous Materials: A Simplified Standard Adsorption Method and a Simplified Broekhoff-de Boer Method", Langmuir 1999, 15, 5403-5409, no month.

Peidong Yang, "Generalized syntheses of large-poremesoporous metal oxides with semicrystalline frameworks", Nature, vol. 396, Nov. 12, 1998.

M. Impéror-Clerc, "Existence of a Microporous Corona around the Mesopores of Silica-Based SBA-15 Materials Templated by Triblock Copolymers", J. Am. Chem. Soc. 2000, 122, 11925-11933 ,Nov. 11, 2000.

R. Evans, "Fluids in narrow pores: adsorption capillary condensation, and critical points", J. Chem. Phys. 84 (4), Feb. 15, 1966.

Stephan Förster, "Amphiphilic Block Copolymers in Structure-Controlled Nanomaterial Hybrids", Adv. Mater, 1998, 10, No. 3 no month.

Michal Kruk, "Characterization of the Porous Structure of SBA-15", Chem. Mater, 2000, 12. 1961-1968, pub date on web: Jun. 20, 2000.

D. W. Gidley, "Determination of pore-size distribution in low-dielectric thin films", Applied Physics Letters vol. 76, No. 10, Mar. 6, 2000.

Jerzy Choma, "Critical appraisal of classical methods for determination of mesopore size distributions of MCM-41 materials", Applied Surface Science 196 (2002) 216-223, no month given.

M. R. Baklanov, "Comparative Study of Porous SOG Films with Different Non-destructive Instrumentation", Proc. Int. Interconnect Technol. Conf. 2001, no month, 4 pages.

C.T. Kresge, "Ordered mesoporous molecular sieves synthesized by a liquid-crystal template mechanism", 1992 Nature Publishing Group Oct. 22, 1992.

\* cited by examiner

MESOPOROUS MATERIALS AND METHODS

CROSS-REFERENCE TO RELATED APPLICATIONS

This application claims priority to Provisional Patent Application No. 60/332,625, entitled "MESOPOROUS MATERIALS AND METHODS," filed on Nov. 21, 2001, the contents of which is incorporated herein by reference in its entirety.

FIELD OF THE INVENTION

This invention relates to mesoporous materials and methods of making the same.

BACKGROUND

Mesoporous materials, such as mesoporous silica and other metal oxides, are of great interest for application in numerous fields. For example, these materials are useful for separation and catalysis applications, and are also attractive candidates for low K dielectric applications. Literature reports indicate these structures can exhibit dielectric constants that can range between 1.3 and 2.1, making them desirable to the microelectronics industry.

To date, most mesoporous metal oxide materials have been prepared using aqueous media. For example, low K dielectric films are typically prepared by spin-casting a water/alcohol solution onto a substrate. These solutions contain a surfactant and a precursor, which develop mesoscale structure through a coordinated self-assembly, usually during evaporation of the solvent. As the solvent evaporates, the surfactant self-assembles into a template to which the precursor simultaneously associates. Removal of the template yields the mesoporous material. This approach is exemplified in U.S. Pat. No. 5,858,457, granted to Brinker.

D. A. Loy et al. (*Chem. Mater.*, 9, 2264, 1997) describes silica aerogels that are prepared by condensation of tetramethoxysilane in supercritical $CO_2$. Formic acid is used as a condensing agent, because agents commonly used for initiating the condensation of silica from a silicon alkoxide, such as $H_2O$, typically have low solubility in $CO_2$.

Porous metal oxides can also be prepared through a casting process using activated carbon as a support material (see, e.g., Wakayama and co-workers (*Chem. Mater.*, 13, 2392 (2001) and *Chem. Mater.*, 12, 756 (2000)). In this method, the activated carbon structures are coated by contact with $CO_2$ solutions of metal alkoxide precursors, and precipitation is induced. The metal oxide precipitates onto the activated carbon structures, conforming to the structures' shape.

SUMMARY

The invention is based on the discovery that a precursor can be deposited within a template to form a mesoporous material (e.g., mesoporous silica and other metal oxides). Methods of the invention include exposing a template (e.g., a preformed block-copolymer) to a precursor, often delivered in supercritical or near supercritical solution (e.g., dissolved in a solvent that is under supercritical or near supercritical conditions), which permeates the template, and on interaction with a reaction reagent and/or catalyst and/or upon heating, the precursor chemically reacts and deposits a material within one or more phases of the template. After the reaction, the template material can be removed, while the deposited material remains intact, yielding a mesoporous structure of the deposited material.

The template can be a structured template (e.g., the template can be patterned or in the form of an ordered array), which yields a structured mesoporous article. Templates can be structured prior to being exposed to the solution. Methods of structuring templates include lithography, ordering the template by applying fields external to the template material, and using surface interactions to order the template material.

The invention also features uses of mesoporous materials formed by the above methods. Potential applications of the materials are in the areas of catalysis, low K dielectrics, environmental sensors, molecular separations, and optical coatings.

In a first aspect, the invention features a method for forming a mesoporous material by (i) providing a template comprising a template material; (ii) permeating the template with a precursor; (iii) reacting the precursor within the template to form a deposit; and (iv) removing template material from the template to form the mesoporous material.

Embodiments of the method can include one or more of the following features. The method can include forming the template. Forming the template can include disposing (e.g., coating, spin-casting) a template precursor (e.g., the template material and a solvent) onto a substrate. The substrate can include any substrate capable of supporting the template. In some embodiments, the substrate is a silicon substrate. The substrate can be a porous substrate. The template material can be homogeneous or inhomogeneous. In some embodiments, the template material includes a polymer (e.g., a homopolymer or a copolymer). The polymer can be a semi-crystalline polymer or an amorphous polymer. In embodiments where the polymer is a copolymer, the copolymer can include a block copolymer. In some embodiments, the template material includes a porogen (e.g., polymer nanospheres or polymer micelles).

The template material can have a decomposition temperature lower than a decomposition temperature of the deposit. For example, the decomposition temperature of the deposit can be greater than about 400° C. (e.g., more than about 450° C., 500° C., 550° C., 600° C., or more), while the template material can have a decomposition temperature of about 400° C. or less (e.g., 350° C., 300° C., 250° C. or less).

In some embodiments, the method can include ordering the template. The template material can be ordered by causing domains in the template material to self-assemble. Alternatively, or additionally, ordering the template material can include applying a field external to the template material, such as an electromagnetic field or a mechanical field. Examples of electromagnetic fields include electric fields (e.g., AC and/or DC) and magnetic fields. Examples of mechanical fields include flow fields and shear fields.

In some embodiments, the precursor is dissolved in a precursor delivery agent. During permeating, the precursor delivery agent can be under supercritical or near-supercritical conditions. The precursor delivery agent can include $CO_2$. In addition, or alternatively, the precursor delivery agent can include a polar liquid.

The precursor can be a metal oxide precursor (e.g., a silica precursor or a titania precursor). Examples of silica precursor include silicon alkoxides. One example of a silica precursor is tetraethylorthosilicate. In various embodiments, the precursor can be one or more of the following: an alkoxide; a silane (e.g., an organotrialkoxysilane, an diorganodialkoxysilane); methyltriethoxysilane; a silicate (e.g., tetraethylorthosilicate); a bridged silsesquioxane; a halosilane; an alkoxysilane; an alkyl silsesquioxanes; an aryl silsesquioxane; and/or titanium alkoxide.

The method can further include providing a reaction reagent, such as water, within the template to promote the precursor reaction within the template. In some embodiments, the template includes a plurality of domains and the reaction reagent is preferentially sequestered within one of the domains. Alternatively, or additionally, the precursor delivery agent can include a reaction reagent to promote the precursor reaction within the template.

In other embodiments, the method can include providing a catalyst, e.g., an acid or photoacid generator, within the template to promote the precursor reaction within the template. In embodiments where the template includes a plurality of domains, the catalyst can be preferentially sequestered within one of the domains.

The method can include heating the template to promote the precursor reaction within the template. In some embodiments, the deposit and the template material phase separate during the reaction, and the template material can include a plurality of domains. The deposit can preferentially form in one of the domains.

The deposit can be or include an inorganic material (e.g., a metal, metal oxide or mixtures thereof). Examples of inorganic deposits are silica and titania. In some embodiments, the deposit can include an organic material (e.g., a polymer). In various embodiments, the deposit can be or include one or more of a hybrid material comprising organic and inorganic components (e.g., an organosilicate, such as a halogenated organosilicate), a halogenated material, a semiconductor material, or a superconductor material.

Removing the template material can include decomposing the template material. Decomposed template material can be extracted from the template. To decompose the template material, the template can be heated, exposed to a solvent, and/or exposed to radiation.

The method can include patterning the template (e.g., using lithography), in which portions of template material are selectively removed prior to or after the template is permeated with the precursor.

The resulting mesoporous material can include pores having a characteristic dimension between about 5.0 and about 2,500 Angstroms. For example, the pores can have a characteristic dimension of less than about 2,500 Angstroms on average (e.g., less than about 2,000, 1,500, 1,000, 500, 250, or 100 Angstroms). In some embodiments, the pores can have a characteristic dimension of more than 5.0 Angstroms (e.g., more than 10, 20, or 50 Angstroms) on average.

The pores can be ordered. For example, the pores can have orientational and/or translational order (e.g., cylindrical pores can be aligned parallel to a common axis, which can be parallel to the plane of the substrate).

The mesoporous material can have a low dielectric constant. For example, the mesoporous material can have a dielectric constant less than 2.5 (e.g., less than 2.4, 2.3, 2.2, 2.1, 2.0, 1.9, 1.8, 1.7, 1.6, 1.5, 1.4, or 1.3 or lower).

The mesoporous material can be hard. For example, the mesoporous material can have a hardness greater than 0.1 GPa (e.g., greater than 0.2, 0.3, 0.4, 0.5, 0.6, 0.7, 0.8 GPa, or greater).

The mesoporous material can have a low refractive index. For example, the mesoporous material can have a refractive index less than 1.4 (e.g., less than 1.3, 1.2, 1.1, or less). Alternatively, or additionally, the mesoporous material can be birefringent.

Embodiments of the invention can include one or more of the features described in regard to aspects of the invention described below In another aspect, the invention features an integrated circuit including a layer of mesoporous material formed using the above-described method (including any of the features described herein), wherein the mesoporous material comprises pores having a characteristic dimension between about 5.0 and about 2,500 Angstroms. In some embodiments of the integrated circuit, the mesoporous material can have a dielectric constant less than 2.5.

In another aspect, the invention features an optical component including a layer of mesoporous material formed using the above-described method (including any of the features described herein), wherein the mesoporous material comprises pores having a characteristic dimension between about 5.0 and about 2,500 Angstroms. In some embodiments of the optical component, the mesoporous material has a refractive index less than about 1.4. Alternatively, or additionally, the mesoporous material can be birefringent.

In another aspect, the invention features a porous membrane including a layer of mesoporous material formed using the above-described method (including any of the features described herein), wherein the mesoporous material comprises pores having a characteristic dimension between about 5.0 and about 2,500 Angstroms.

In another aspect, the invention features a method for forming a mesoporous article by (i) forming a template from a template material, the template including a plurality of domains; (ii) permeating the template with a precursor; (iii) reacting the precursor within at least one domain of the template; and (iv) removing template material from the template to form the mesoporous article. This method can include one or more of the features of the methods and/or aspects of the invention described herein. For example, the method can include one or more of the following features.

Permeating the template (e.g., a polymer, such as a block copolymer, e.g., a diblock coplolymer and/or a triblock copolymer) with the precursor can include permeating the template with a precursor delivery agent (e.g., $CO_2$). The precursor can be dissolved in the precursor delivery agent. During permeating, the precursor delivery agent can be a supercritical or near-supercritical fluid. Permeating the template can include permeating at least one of the domains with the precursor.

In another aspect, the invention features a method that includes: (i) forming a template from a homopolymer (e.g., an amorphous homopolymer or a semi-crystalline homopolymer); (ii) permeating the template with a precursor; and (iii) reacting the precursor within the template to form a deposit within the template. This method can include one or more of the features described herein. For example, the method can include removing the homopolymer from the template to form a mesoporous article. Reacting the precursor within the template can cause the template material and the deposit to phase separate. The deposit can be an organic material (e.g., a polymer). The deposit can be an inorganic material (e.g., a metal or a metal oxide).

In a further aspect, the invention features a method for creating a metal oxide article (e.g., of silica or titania) by (i) forming a template from a template material, the template including a plurality of domains; (ii) permeating the template with a metal oxide precursor (e.g., an alkoxide or tetraethylorthosilicate); and (iii) reacting the precursor within at least one domain of the template to form a metal oxide. The method can include removing template material from the template to form the mesoporous metal oxide. This method can include one or more of the features and/or aspects described herein.

In another aspect, the invention features a method for creating a structured article by (i) forming a template layer from a template material; (ii) patterning the template layer to form a structured template; (iii) permeating the structured template with a precursor; and (iv) reacting the precursor within the structured template to form the structured article. The method can include one or more of the features and/or aspects described herein.

Patterning the template can include exposing the template to radiation. The radiation can cause the template material to crosslink in portions of the template. Alternatively, or additionally, the radiation can cause the template material to decompose in portions of the template. The template can be patterned lithographically.

In another aspect, the invention features a method for creating an ordered article. The method includes the following steps: (i) applying an external field (e.g., an electric field, a magnetic field, a flow field, and/or a shear field) to a template material to assemble an ordered template from the template material; (ii) permeating the ordered template with a precursor; and (iii) reacting the precursor material within the ordered template. The method can include one or more of the features described herein. For example, reacting the precursor within the ordered template can form a deposit within the ordered template. The method can include removing template material from the ordered template to form a mesoporous structured article. The ordered template can be permeated with the precursor under supercritical or near-supercritical conditions.

In yet another aspect, the invention features a method for forming an integrated circuit by (i) forming a template layer on a substrate, the template layer comprising a template material; (ii) permeating the template with a precursor; (iii) reacting the precursor within the template to form a deposit; (iv) removing the template material to form a dielectric layer; and (v) processing the substrate and/or dielectric layer to create the integrated circuit. This method too can include one or more of the features and/or aspects described herein. For example, the method can include one or more of the following features.

The method can include forming an additional layer on the deposit or dielectric layer (e.g., a copper layer or a layer of some other conductor, such as aluminum). The additional layer can be polished. The additional layer can be polished before or after removing template material.

In a further aspect, the invention features a method for forming a coated optical component by (i) providing the optical component; (ii) forming a template layer on a surface of the optical component, the template layer including a template material; (iii) permeating the template with a precursor; (iv) reacting the precursor within the template to form a deposit; and (v) removing template material from the template to form a coating on the optical component. The method can include one or more of the features and/or aspects described herein. For example, the method can include one or more of the following features.

The method can include polishing the deposit or the coating to form an optically flat surface (e.g., to have a surface profile that deviates less than about 500 nm from an average (e.g., less than about 300, 200, 100, 50, or 10 nm). The deposit can be polished before or after removing the template material.

In another aspect, the invention features a method for making a permeable membrane including a mesoporous layer by (i) providing a porous substrate; (ii) forming a template layer on the substrate, the template layer including a template material; (iii) permeating the template with a precursor; (iv) reacting the precursor within the template to form a deposit; and (v) removing template material from the template to form the mesoporous layer on the substrate, thereby forming a permeable membrane comprising pores having a characteristic dimension between about 5.0 and about 2,500 Angstroms. The method can include one or more of the features and/or aspects described herein.

As used herein, a "supercritical solution" (or solvent or fluid) is one in which the temperature and pressure of the solution (or solvent or fluid) are greater than the respective critical temperature and pressure of the solution (or solvent or fluid). A supercritical condition for a particular solution (or solvent or fluid) refers to a condition in which the temperature and pressure are both respectively greater than the critical temperature and critical pressure of the particular solution (or solvent or fluid).

A "near-supercritical solution" (or solvent or fluid) is one in which the reduced temperature (actual temperature measured in Kelvin divided by the critical temperature of the solution (or solvent or fluid) measured in Kelvin) is greater than 0.8 and reduced pressure (actual pressure divided by critical pressure of the solution (or solvent or fluid)) of the solution (or solvent fluid) is greater than 0.5, but the solution (or solvent or fluid) is not a supercritical solution. A near-supercritical condition for a particular solution (or solvent or fluid) refers to a condition in which the reduced temperature is greater than 0.8 and reduced pressure is greater than 0.5 but the condition is not supercritical. Under ambient conditions, the solvent can be a gas or liquid. The term solvent is also meant to include a mixture of two or more different individual solvents.

Embodiments of the invention can provide one or more of the following advantages. The precursors can be easily dissolved into solvents, with no additional additives required. In addition, the solvents can be inert with respect to the reagents, and do not partake in the precipitation of the reaction product. In some cases, the new methods can reduce reaction times compared with techniques wherein the solvent inhibits, or otherwise slows, the reaction. Secondary reaction products are also soluble in the solvent, and the solvent can remove secondary reaction products from the reaction site.

The methods can be substantially non-aqueous in nature, and can also obviate the need for water/alcohol solutions as the reaction media. The temperature at which the reaction is performed can also be increased above that used for aqueous preparations at atmospheric pressure. The elevated temperature can enhance the reaction rate.

Self-assembly of the template can be decoupled from the presence of the reagents, providing increased flexibility with respect to the framework chemistry over systems in which both reagents and surfactants must participate in the self-assembly process. For example, precursors can be used without concern for its solubility in the template solvent. Additionally, the supercritical or near-supercritical solvent for the precursor does not dissolve the template, but only dilates it slightly. Thus, the template can be prepared in an independent step and the resulting composite material will retain the net shape of the template. Finally, using a supercritical or near-supercritical solvent for the precursor and a template that is insoluble, in the supercritical or near supercritical solvent the partitioning of the precursor between the solvent and the template can be controlled by adjusting solvent density through changes in pressure.

The methods can substantially reduce or eliminate shrinkage of the templated mesoporous material during and/or after removal of the template by calcination or other methods. Shrinkage upon calcination can be an undesirable artifact of traditional synthesis of mesoporous silica and can lead to cracking of mesoporous films and monolith.

Template morphology can be manipulated by adjusting one or more morphological parameter(s). For example, template morphology can be manipulated by adjusting template composition, template swelling, surface interactions, and/or external fields.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, and examples are illustrative only and not intended to be limiting.

Other features and advantages of the invention will be apparent from the following detailed description, and from the claims.

DESCRIPTION OF DRAWINGS

Like reference symbols in the various drawings indicate like elements.

DETAILED DESCRIPTION

General Methodology

Figure 1:
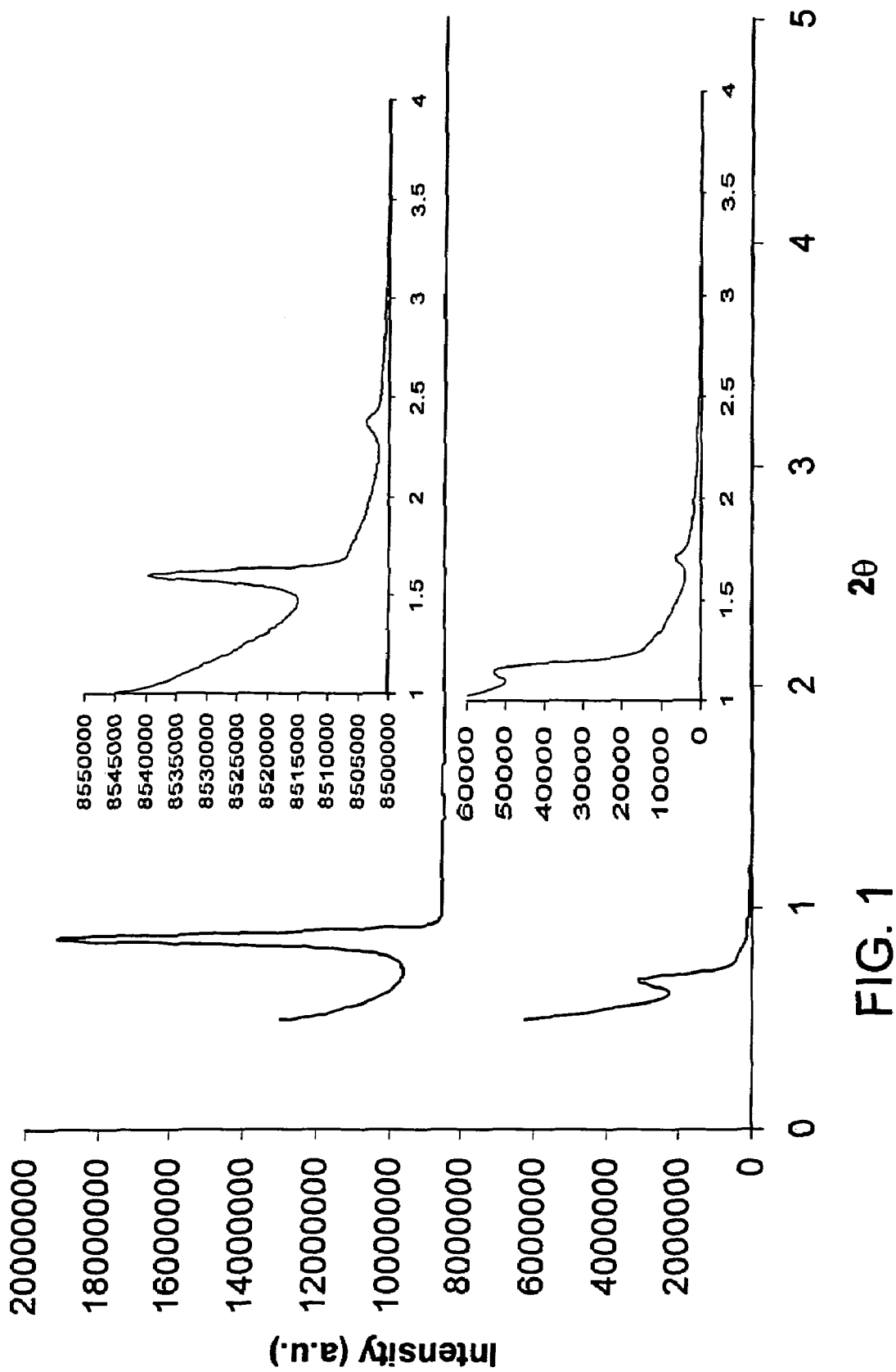
FIG. 1 is a set of X-ray Diffraction (XRD) patterns of a mesoporous film produced according to Example 1. The top trace (and top inset) shows the XRD pattern for the calcined film. The bottom trace (and bottom inset) shows the XRD pattern for the as-infused film.

Mesoporous materials are prepared in two or more principal steps: (i) a suitable template is obtained or prepared; and (ii) the template is permeated with a precursor, which deposits a reaction product (or deposit) within the template. In some embodiments, the template is removed, leaving behind the mesoporous material.

As used herein, mesoporous materials refer to materials having pores on the order or about 5.0 to 2,500 Angstroms in dimension. In general, the shape of pores in a mesoporous material may vary. In some embodiments, pores in a mesoporous material are randomly shaped. Examples of pore shapes include substantially spherical pores, substantially ellipsoidal pores, substantially cylindrical pores, substantially rectangular pores, or substantially cubic pores. The extent to which pores are ordered (have translational and/or orientational order) in a mesoporous material can also vary. In some embodiments, pores are not ordered, and randomly permeate the mesoporous material. In some embodiments, pores can possess orientational order. For example, the cylindrical pores can be aligned substantially parallel to a common axis. In some embodiments, pores can possess translational order. For example, pores can be layered and/or closed packed (e.g., 3-D cubic packed spheres or 3-D hexagonally packed spheres). In further embodiments, pores can possess both translational and orientational order, e.g., hexagonally packed cylinders. The pore size and/or degree of order can be determined using, e.g., X-ray diffraction techniques or Small Angle X-ray Scattering techniques.

The first step for preparing mesoporous materials includes providing a template having a desired mesoscale structure. For example, suitable templates for the formation of mesoporous metal oxide films can be made from block copolymers, such as polyethylene oxide—polypropylene oxide—polyethylene oxide (PEO-PPO-PEO) triblock copolymers. These copolymers can be spin-cast from solution onto a substrate. During evaporation of the solvent, the block copolymer self-assembles into distinct phase domains, the different phases being formed from the different blocks. A catalyst or reagent (e.g., p-toluene sulphonic acid (PTSA)) is included in the template, and is usually partitioned in one of the template phases (for example, PTSA is sequestered in the PEO phase). The domains of this phase provide the mesoscale structure that, at least in part, dictates the final structure of the mesoporous material.

In the second step, a precursor permeates into the template layer. Permeating the template layer with the precursor causes molecules of the precursor to diffuse into and through at least one domain in the template material. A catalyst or reagent sequestered within the template initiates a local condensation reaction of the precursor within the template, and the reaction product (e.g., silica for TEOS) deposits onto the template structure (domains) yielding a template/deposition product composite.

In some embodiments, the precursor is delivered using a delivery agent (e.g., in a supercritical fluid (SCF) or near-SCF solution). For example, tetraethylorthosilicate (TEOS) dissolved in supercritical or near supercritical $CO_2$ can deposit silica within a suitable template. Additional reagents/catalysts necessary for deposition of the reaction product may be delivered with the precursor. Water is one example of a reagent that may be included in a supercritical or near supercritical $CO_2$ solution. For brevity, we will use the term precursor mixture to refer to the precursor, precursor delivery agent, and any other components delivered with the precursor that assist in or enable the precursor to permeate the template, and/or enable the reaction product to deposit within the template.

In some embodiments, the template is removed after deposition of the reaction product, leaving a mesoporous structure of the reaction product (e.g., mesoporous silica). Usually, the mesoporous structure has a similar morphology to that of the template. For example, in the case of a block copolymer template, where the reaction product occupies regions corresponding to the domains of one particular phase of the block copolymer. Template removal is often accomplished by decomposition of the template material, (e.g., by calcination or exposure to other energy sources including UV radiation or plasmas).

Template Materials and Methods

Templates can be prepared from any material or combination of materials that possess the desired level of mesoscopic ordering (i.e., that exhibit structure over sub-micrometer length scales), that include portions (e.g., domains) that are permeable to a desired precursor mixture, and that are compatible with the precursor condensation chemistry. Template materials can include organic materials (e.g., polymers, organic compounds, and assemblies of organic compounds) and inorganic materials (e.g., salts and clays).

Examples of template materials include block copolymers. Block copolymers contain a linear arrangement of blocks, a block being a portion of a polymer molecule in which the monomeric units have at least one constitutional (e.g., the chemical makeup of the blocks) or configurational (e.g., the arrangement of atoms in the blocks) feature different from adjacent blocks. Under suitable conditions (e.g., within a favorable temperature and relative concentration range), some block copolymers self-assemble into domains of predominantly a single block type.

Suitable block copolymers include polyethylene oxide—polypropylene oxide—poly ethylene oxide (PEO-PPO-PEO) triblocks and polystyrene-polyethylene oxide (PS-PEO) diblocks, poly(dimethylsiloxane)—polyethylene oxide diblock and triblock copolymers, and polyethylene-polyethylene oxide block copolymers.

In some embodiments, block copolymers include at least one block that has a particular affinity for one or more components of a precursor mixture. By inherently attracting selected components of the precursor mixture, the template can enhance partitioning of those components in desired phase domains of the block copolymer. For example, at least one of the blocks could be hydrophilic and/or $CO_2$-philic, thereby enhancing permeation of water, hydrophillic precursors and/or $CO_2$ within those blocks. Additionally, one block can be hydrophilic and a second block can be $CO_2$-philic. As another example, a block can be selected with which the precursor selectively reacts and/or partitions.

Furthermore, block copolymers can include at least one other block that is phobic to a precursor mixture or precursor mixture component. A block that is phobic would inhibit permeation of the precursor mixture, or component, from the template phase composed of the block. For example, a block copolymer can include a hydrophilic block and a hydrophobic block. Water can be selectively partitioned into a template phase composed of the hydrophilic block phase. In another example, one block can exhibit very low permeability to a SCF solution while the other block is readily swollen by the same solution.

In some embodiments, block copolymers that contain at least one block are chosen that can serve as a positive or negative photoresist. These block copolymers could then be lithographically patterned prior to, during, or after infusion of the precursor.

The morphology of a phase-separated block copolymer can vary. For example, the block copolymer can include discrete domains of a first block type embedded in a matrix of a second block type. Alternatively, the block copolymer can include interpenetrating domains.

In addition, domain size can be varied as desired. Domain size can be influenced by molecular weight of the blocks. In some cases, a characteristic dimension of domain size is proportional to the square root of the molecular weight. Domains can be in the nanometer to tens of nanometers range. Alternatively, the domains can be on the order of micrometers, or larger, in size. The mesoporous structure is derived from the domain structure, hence domain size is usually controlled to satisfy the properties of the mesoporous material in the final application. Factors affecting domain size and structure are discussed below.

Block copolymers can also exhibit additional phase ordering within template domains that further influence the morphology of the mesoporous material. For example, crystalline or liquid crystalline polymeric units display varying degrees of translational or orientational order between units. One or more blocks can be chosen to have these properties, so that the polymeric units order within the template domains formed of these blocks. Mesoporous material deposited in these domains may manifest artifacts of this ordering, such as periodic variations in density within the ordered domains. In instances where at least one block is semi-crystalline, the mesoporous material can exhibit structures arising both from the phase separated copolymer domains and the crystal structure in one or both domains. This can occur under conditions in which infusion and reaction of the precursor proceeded in the amorphous regions but not in the crystalline regions of a semi-crystalline phase domain. The presence of a least one semi-crystalline phase domain during the templating process can also reduce or prevent the bulk dilation of the template.

Several parameters affect block copolymer morphology. These parameters can be varied to tailor the template structure to a desired form. Typically, the chemical structure of the monomeric units making up each block dictate the interaction between monomers forming each block and chemical bonding between blocks, both of which influence block copolymer morphology. For example, inclusion of a mesogenic moiety (e.g., a cyano biphenyl moiety) in a monomer can result in ordering within domains, as described above. Furthermore, monomer chemistry also influences block miscibility, and will strongly influence phase separation/self-assembly of the block copolymer into phase domains.

The relative lengths of the blocks in the block copolymer also influence template morphology. Phase morphology can vary between spheres to cylinders to alternating lamellae depending on the relative length of each block. For example, a block copolymer containing short blocks of unit A, and relatively longer blocks of unit B, can result in spheres containing blocks of unit A within a continuous phase of the longer blocks of unit B. Alternating lamellae tend to form when the blocks are about the same length, and cylinders form for intermediate cases.

In some embodiments, the copolymer architecture is manipulated by the addition of homopolymers and/or swelling agents. For example, one or more homopolymers of one or more of the blocks in the block copolymer can be added to increase the repeat distance of the blocks. Examples of this technique are described in U.S. patent application Ser. No. 09/814,891, published May 9, 2002, as U.S. Patent Application 20020055239, and by Urbas et al. (*Adv. Mater*, 12, 812 (2000)). Furthermore, swelling agents that exhibit lower solubility in the SCF than the precursor (such as, e.g., dioctylphthalate, squalene, or polypropylene oxide) can be selective or non-selective for a given block can be applied to the template. In some cases, selective swelling agents can induce order-disorder transitions (e.g., transitions between ordered states having different morphologies) within the template, which will further modify the copolymer architecture. Selective swelling is further discussed by K. J. Hanley, T. P. Lodge, and C. I. Huang (*Macromolecules*, 33, 5918 (2000)), for example.

In further embodiments, template morphology is altered during the precipitation reaction. For example, reagents and reaction by-products can selectively partition into different domains, leading to dilation of the template, which increases the size of those features of the mesoporous material compared to the corresponding features in the pre-dilated template.

Other examples of template materials include homopolymers (e.g., amorphous or semi-crystalline homopolymers), hyperbranched polymers or blends of homopolymers and/or hyperbranched polymers and random copolymers. Examples of homopolymers include poly(methacrylic acid), poly (acrylic acid), polyethylene oxide, polycaprolactone, poly (lactic acids) and poly(vinyl alcohol). Examples of hyperbranched polymers include the aliphatic polyesters. Examples of copolymers include poly(methyl methacrylate-co-dimethyl amino ethyl methacrylate).

In some embodiments, where the template material includes a homopolymer, the homopolymer phase separates from the material deposited within the template during the deposition process. This phase separation yields domains rich in the polymer template material and domains rich in the deposited material. Phase separation can be spinodal or binodal in nature. Phase separation may occur at any point during deposition of the deposited material (e.g., during reaction of the precursor within the template). Subsequent removal of the template material can then be used to produce a porous material. Such porous materials can exhibit features having length scales that are dictated, at least in part, by the domain sizes of the phase-separated or partially phase-separated materials.

Alternatively, in some embodiments having homopolymer template material, phase separation of the template material and deposited material into distinct domains does not occur, but removal of the template after infusion and deposition of the deposited material results in a porous material having a lower bulk density than a nonporous sample of the deposited material.

In some embodiments, a template may be composed of a homogeneous polymer matrix physically mixed with one or more other components that function as porogens. As used herein, a porogen refers to any material that can cause a difference in the partitioning and/or reactivity of the precursor and/or can alter the structure of the material produced using the matrix polymer. Examples of porogens include nanospheres or micelles of a polymer (or mixture of polymers) different from the template material. The nanospheres may be modified to improve compatibility with the template. Examples of chemical functionality that may improve compatibility include alkoxy and acetoxy groups.

In some embodiments, porogens may be functionalized to provide covalent attachment to another moiety. Examples include functional groups that react to form covalent bonds. These can include groups that can undergo radical and condensation reactions (e.g., functional groups that can react include vinyl, alkoxy, acetoxy, hydroxy, silane groups and others). In some embodiments the functional groups may be introduced by copolymerization.

Porogens may exhibit branched or three-dimensional star architectures (e.g., dendrimers, hyperbranched polymers, and graft block copolymers with a "comb" structure). In some embodiments, the porogens may be chiral (e.g., chiral salts or chiral liquid crystal polymers) and/or designed to impart specific chemical or biological recognition elements to the mesoporous material.

In general, the thickness of the template layer can be varied as desired. Template thickness often determines the thickness of the mesoporous film. In some embodiments, template films are less than one micrometer thick (e.g., less than 0.5, 0.3, or 0.1 micrometers). In alternative embodiments, template films are at least one micrometer thick (e.g., at least 2, 3, 5, or 10 micrometers). In general, templates are not limited to thin films. Bulk templates can also be used to prepare bulk mesoporous materials (e.g., templates can be on the order of millimeters or centimeters thick).

Template layers are typically prepared by first disposing or depositing a layer of template material onto a substrate. The substrate provides mechanical support for the template and the resulting mesoporous film. Typically, the type of substrate will depend on the specific application of the mesoporous film. For example, a silicon wafer can be used as a substrate for microelectronics applications. As another example, a porous substrate can serve as a supporting layer for a mesoporous membrane or other mesoporous separation medium. The substrate can be an integral part of a final product if the mesoporous film is part of a composite article (e.g., a microchip can include a mesoporous layer on a silicon wafer substrate). Suitable substrates include silicon wafers, glass sheets, polymer webs, silicon carbide, gallium nitride, and metal, metal oxide, or semiconductor layers deposited onto these substrates etc.

The template material(s) can be disposed on the substrate in a number of ways. Generally, the template is disposed on the substrate in a way that consistently yields a template layer having a desired thickness and composition. For example, the template material can be coated onto the substrate (e.g., spin-cast, knife-coated, bar-coated, gravure-coated, or dip-coated). The template material can be coated out of solution, and the solution evaporated to yield a layer of template material. The template material can also be evaporated onto a substrate.

A catalyst (or reaction reagent) can be incorporated into the template layer. A catalyst is often required to initiate the precipitation of the precursor onto the template. In some embodiments, the catalyst is sequestered in one phase of the block copolymer template, ensuring that precipitation occurs primarily within the domains of that phase. In other embodiments, a catalyst that is activated by exposure to light or other forms of radiation is incorporated into one or more of the phase domains. One example of such a catalyst is a photoacid generator. Examples of photoacid generators include perfluorooctyl sulfonate, diaryliodionium hexafluoroantimonate, Diphenyliodonium 9,10-dimethoxyanthracenesulfonate isopropylthioxaanthone,[4-[(2-hydroxytetradecyl)oxy]phenyl] phenyliodonium hexafluoroantimonate, and triphenylsulfonium hexafluoroantimonate. The catalyst can then be activated in selected regions of the template by selective exposure. In another embodiment an inhibitor to the reaction involving the precursor can be incorporated into one or more of the phase domains.

The catalyst can be included in the coating solution from which the template layer is cast, or it can be applied to the template layer in a separate process step. Often, the catalyst is a distinct chemical compound that does not react with the block copolymer of the template. In some cases, the catalyst can be chemically incorporated into a block of the block copolymer, or can be the block itself.

The chemical nature of the catalyst is determined primarily by the precursor material and nature of the desired precipitation reaction. Some acid catalysts, such as p-toluene sulfonic acid (PTSA), are suitable for initiating metal oxide condensation from their alkoxides (e.g., silica condensation from TEOS). Compatibility with the template, or at least one phase of the template, is another factor in catalyst selection. PTSA is a suitable catalyst for use with a PS-PEO template, and is sequestered in the PEO domains. A non-limiting summary of metal oxide precursors and catalyst systems is available in *Sol-Gel Science* by Brinker and Scherer.

Template layers can be patterned or ordered once the layer has been disposed on the substrate. For example, standard lithographic techniques (e.g., ultraviolet light or electron beam lithography) can be used to create a patterned template having three-dimensional structure.

In some embodiments, portions of the template are directly exposed to radiation, resulting in a local change in the template structure and/or chemistry. One example is the exposure of a PS-PEO template to ultraviolet radiation. The ultraviolet radiation etches the PEO phase, which can then be removed. Additionally, the ultraviolet radiation cross-links the PS phase. Since deposition of silica is often catalyzed by acid sequestered in the PEO domains and occurs preferentially in these domains, removal of this phase will prevent silica condensation in regions of the copolymer exposed to the ultraviolet radiation.

Alternatively, the template is coated with a standard photoresist, and the photoresist is selectively exposed to radiation. The photoresist is developed to expose portions of the underlying template, which are then etched away (e.g., wet etched or plasma etched). Removal of the residual photoresist yields a patterned template.

Selective exposure of the template or photoresist to radiation can be achieved in one or more of a variety of ways. For example, a radiation beam (e.g., an electron beam) focused to a spot can be rastered across the exposure surface. In another example, portions of the exposure surface are selectively masked from a blanket exposure to radiation using a shadow-mask. In a further example, the radiation forms an interference pattern, to which the template is exposed.

Typically, lithographic methods can be used to form channels, islands, and/or tiered relief structures in the template. These structures can be on the scale of hundreds of micrometers to less than one micrometer in size.

Ordering Template Domains

Under appropriate conditions, template domains can be ordered (e.g., positionally oriented or orientationally ordered) by self-assembly. For example, block copolymers can self-assemble into a cylindrical morphology when heated above the glass transition temperature of the copolymer and an electric field can be applied to orient, e.g., vertically orient, the cylinders within the copolymer. The method of using an electric field to orient the template relies on differences between the dielectric constants of the components of the block copolymer. Analogously, a magnetic field can be used to orient the template when a sufficient difference between the magnetic dipole moments of the components exists.

For electric-field induced orientation, different chemical constituents of the blocks of the copolymer can result in a difference in the dielectric constants of the copolymer domains. A difference of about 0.1 percent in the dielectric constants can result in a specific, e.g., vertical, orientation. In an electric field, the orientation dependent polarization energy associated with the cylinders, dielectric bodies that are anisotropic in shape, will align the cylinders in parallel to the electric field lines.

Under sufficiently strong fields parallel to the substrate, surface alignment of the morphology can usually be overcome, producing cylindrical domains oriented in parallel with the fields. The cylindrical domains can be normal to and extend through the template layer.

Heating the template above the glass transition temperature of the co-polymer blocks makes the polymer molecules mobile and allows them to flow more easily. Alternative methods can also be used to achieve this effect, usually by lowering the glass transition temperature below ambient temperature. One can, for example, add a plasticizer or a solvent to the template to mobilize the copolymer molecules and allow them to move and self-assemble. After an orienting field is applied, the plasticizer or solvent is removed to immobilize the molecules. Thereafter, the orienting field is removed, but the immobilized molecules retain their orientation. In some embodiments, the supercritical or near-supercritical solvent can mobilize the template molecules. In such cases, it is conceivable that template orientation and precursor precipitation could occur simultaneously.

Ordering of block copolymer templates can also be facilitated by means other than electromagnetic fields. For example, anisotropically shaped domains, such as cylindrical or disc-shaped domains, can be ordered in flow or shear fields. Anisotropic objects tend to orient in flow fields to present the smallest cross-sectional area to the flow field lines. Hence, cylindrical domains would tend to align with their cylindrical axes parallel to the flow field, provided the aspect ratio (ratio of height to diameter) of the cylinders is greater than one.

Block copolymers can also be ordered by surface interactions. A substrate surface can be chemically treated (e.g., with a surfactant) prior to coating with the template layer. The template layer could then spontaneously orient in a predetermined way on interaction with the chemical surface treatment. For example, a thin film of a random copolymer having hydrophobic and hydrophilic monomer units can be coated onto a substrate to produce a neutral surface for a block copolymer template. The block copolymer can be composed of the same monomer as used in the random copolymer, which would yield spherical domains of the hydrophobic block within a hydrophilic matrix.

Further details on the use of fields and surface treatments to induce order can be found in, for example, T. Thurn-Albrecht, et al. (*Advanced Materials*, 12, 2000, p. 787) and in U.S. patent application Ser. No. 09/814,891. Other approaches to ordering templates include chemical modification of substrates using microcontact printing, as disclosed by Heier et al. (*J. Chem. Phys.*, 111, p. 11101 (2001)), use of directional crystallization of a solvent (see, for example, C. Park et al. (*Macromolecules*, 34, p. 2602 (2001))), and the use of roll-casting for the preparation of bulk materials (see, for example, R. J. Albalak and E. L. Thomas (*J. Polym. Sci. Polym. Phys. Ed.*, 31, p. 37 (1993))).

A portion (or portions) of the template can be crosslinked once the ordered template has formed. For example, at least one domain of an ordered block co-polymer can include a compound that crosslinks in the presence of ionizing radiation (e.g., UV radiation). Examples of such compounds include polymers, such as polyethylene, some polyolefins, and poly (vinyl chloride). Crosslinking can impart mechanical stability to the template, which may be advantageous, especially in embodiments where the template is likely to undergo additional processing (e.g., mechanical and/or chemical processing).

Precursor Delivery into Templates

In general, any means by which to permeate the template with the precursor that does not detrimentally alter the template morphology, or detrimentally affect the deposition chemistry, can be employed. Often, the precursor is delivered by way of a delivery agent, e.g., in a solvent. For example, the precursor can be dissolved in a supercritical or near supercritical fluid. The SCF or near SCF solution is then infused into the template, and the precursor reacts with a reagent/catalyst partitioned in one or more of the template domains.

In the discussion that follows, precursor delivery in both batch and continuous mode is described by way of example. A typical batch run in which a precursor in a SCF solution is delivered to a template layer involves the following general procedure. A single substrate and a known mass of precursor are placed in a reaction vessel (e.g., a stainless steel pipe), which is sealed, purged with solvent, weighed, and immersed in a circulating, controlled temperature bath. The vessel is then filled with solvent, containing a known amount of precursor, e.g., using a high-pressure manifold. The contents of the reactor are brought to a specified temperature and pressure at which the solvent is a supercritical or near-supercritical solvent. The solution permeates the template. The precursor dissolved in the solvent interacts with the catalyst or other reagent, which is preferentially sequestered in specific domains within the template. The precursor reacts within template in these domains. The vessel is maintained at this condition for a period of time sufficient to ensure that the solution has completely penetrated the template and that the precursor has reacted, precipitating a reaction product onto the template. The reaction is typically carried out for at least one hour, though the reaction can be complete at times much less than one hour, e.g., less than 20 minutes or even less than 30 seconds. The optimal length of reaction time can be determined empirically. When the reactor has cooled, the substrate is removed and can be analyzed or further treated to remove the template.

A continuous precursor delivery process is similar to the above batch method except that known concentrations of the supercritical (or near-supercritical) solution is taken from a reservoir and continuously added to a reaction vessel containing multiple substrates as supercritical solution containing precursor decomposition products or unused reactants is continuously removed from the reaction vessel. The flow rates into and out of the reaction vessel are made equal so that the pressure within the reaction vessel remains substantially constant. The overall flow rate is optimized according to the particular reaction. Prior to introducing precursor-containing solution into the reaction vessel, the reaction vessel is filled with neat solvent (which is the same as the solvent in the precursor solution) at supercritical or near-supercritical pressures and is heated to supercritical or near-supercritical temperatures. As a result, supercritical or near-supercritical conditions are maintained as the precursor-containing solution is initially added to the reaction vessel.

Solubility of the precursor at the reaction conditions can be verified in a variable volume view cell, which is well known in the art (see, for example, McHugh et al., *Supercritical Fluid Extraction: Principles and Practice*, Butterworths, Boston, 1986). Known quantities of precursor and supercritical solvent are loaded into the view cell, where they are heated and compressed to conditions at which a single phase is observed optically. Pressure is then reduced isothermally in small increments until phase separation (either liquid-vapor or solid-vapor) is induced.

The temperature and pressure of the process depend on the reactants and choice of solvent. Generally, temperature is less than 250° C. and often less than 100° C. (e.g., less than about 90° C., 80° C., 70° C., 60° C., 50° C., or 40° C.), while the pressure is typically between 50 and 500 bar (e.g., between about 75 bar and 300 bar, 90 bar and 200 bar, 100 bar and 150 bar, 110 bar and 140 bar, or 120 bar and 130 bar). A temperature gradient between the substrate and solution can also be used to enhance chemical selectivity and to promote reactions within the template.

Solvents useful as SCFs are well known in the art and are sometimes referred to as dense gases (Sonntag et al., *Introduction to Thermodynamics, Classical and Statistical*, 2nd ed., John Wiley & Sons, 1982, p. 40). At temperatures and pressures above certain values for a particular substance (defined as the critical temperature and critical pressure, respectively), saturated liquid and saturated vapor states are identical and the substance is referred to as a SCF. Solvents that are SCFs are less viscous than liquid solvents by one to two orders of magnitude. The low viscosity of the supercritical solvent and absence of surface tension facilitates improved transport (relative to liquid solvents) of reagent to, and decomposition products away from, the template. This is particularly advantageous in ensuring complete permeation of the template layer by the solution. Furthermore, the solubility of many precursors increases in supercritical solvents, relative to various liquids and gases. Generally, a supercritical solvent can be composed of a single solvent or a mixture of solvents, including for example a small amount (<5 mol percent) of a polar liquid co-solvent such as ethanol (or other alcohol).

It is desirable that the reagents are sufficiently soluble in the supercritical solvent to allow homogeneous transport of the reagents. Solubility in a supercritical solvent is generally proportional to the density of the supercritical solvent. Ideal conditions for precursor transport include a supercritical solvent density of at least 0.1 to 0.2 g/cm$^3$ or a density that is at least one third of the critical density (the density of the fluid at the critical temperature and critical pressure).

Table 1 below lists some examples of solvents along with their respective critical properties. These solvents can be used by themselves or in conjunction with other solvents to form the supercritical solvent. Table 1 lists the critical temperature, critical pressure, critical volume, molecular weight, and critical density for each of the solvents.

TABLE 1

CRITICAL PROPERTIES OF SELECTED SOLVENTS

| Solvent | $T_c$ (K) | $P_c$ (atm) | $V_c$ (cm/mol) | Molecular Weight | $\rho c$ (g/cm$^3$) |
|---|---|---|---|---|---|
| $CO_2$ | 304.2 | 72.8 | 94.0 | 44.01 | 0.47 |
| $C_2H_6$ | 305.4 | 48.2 | 148 | 30.07 | 0.20 |
| $C_3H_8$ | 369.8 | 41.9 | 203 | 44.10 | 0.22 |
| n-$C_4H_{10}$ | 425.2 | 37.5 | 255 | 58.12 | 0.23 |
| n-$C_5H_{12}$ | 469.6 | 33.3 | 304 | 72.15 | 0.24 |
| $CH_3$—O—$CH_3$ | 400 | 53.0 | 178 | 46.07 | 0.26 |
| $CH_3CH_2OH$ | 516.2 | 63.0 | 167 | 46.07 | 0.28 |
| $H_2O$ | 647.3 | 12.8 | 65.0 | 18.02 | 0.33 |
| $C_2F_6$ | 292.8 | 30.4 | 22.4 | 138.01 | 0.61 |

To describe conditions for different supercritical solvents, the terms "reduced temperature," "reduced pressure," and "reduced density" are used. Reduced temperature, with respect to a particular solvent, is temperature (measured in Kelvin) divided by the critical temperature (measured in Kelvin) of the particular solvent, with analogous definitions for reduced pressure and density. For example, at 333 K and 150 atm, the density of $CO_2$ is 0.60 g/cm$^3$; therefore, with respect to $CO_2$, the reduced temperature is 1.09, the reduced pressure is 2.06, and the reduced density is 1.28. Many of the properties of supercritical solvents are also exhibited by near-supercritical solvents, which refers to solvents having a reduced temperature and a reduced pressure greater than 0.8 and 0.6, respectively, but not both greater than 1 (in which case the solvent would be supercritical). One set of suitable conditions for template infusion include a reduced temperature of the supercritical or near-supercritical solvent of between 0.8 and 1.6 and a critical temperature of the fluid of less than 150° C.

Carbon dioxide ($CO_2$) is a particularly good choice of solvent. Its critical temperature (31.1° C.) is close to ambient temperature and thus allows the use of moderate process temperatures (<80° C.). It is also unreactive with many desirable precursors and is an ideal media for running reactions between gases and soluble liquids or solid substrates.

Precursors and Reaction Mechanisms

Precursors are chosen so that they yield a desired deposit material in the template following reaction facilitated by the catalyst (or reaction reagent). Deposits can include oxides (e.g., $SiO_2$ and $TiO_2$), or mixed metal or mixed metal oxides (e.g., a superconducting mixture such as Y—Ba—Cu—O), metals (e.g., Cu, Pt, Pd, and Ti), elemental semiconductors (e.g., Si, Ge, and C), compound semiconductors (e.g., III-V semiconductors such as GaAs and InP, II-VI semiconductors such as CdS, and IV-VI semiconductors such as PbS). Oxides, such as metal oxides (e.g., oxides of Si, Zr, Ti, Al, and V) are an important class of materials for mesoporous articles. Precursors for oxide deposition include alkoxides, such as TEOS for silica deposition. Deposits can also include halogenated compounds (e.g., a fluorinated, chlorinated, brominated or iodinated compounds).

In some embodiments, the precursor is a monomer or mixture of monomers and the deposited material is a polymer or a mixture of polymers. In such cases, the deposited polymer can exhibit a decomposition temperature substantially above the decomposition temperature of the template material (e.g., a template polymer). Once the high temperature polymer is deposited, the template polymer can be removed. A catalyst for monomer polymerization can optionally be deposited selectively within one domain of a copolymer template or one domain of the copolymer template may possess chemical functionality such as acid groups that catalyses the polymerization. In another embodiment a block copolymer template may be chosen such that monomer precursor preferentially partitions into one domain of the block copolymer. Non-limiting examples of polymers with high decomposition temperatures (e.g., greater than about 450° C. or 500° C., such as 550° C. or more) include aromatic polymers, such as polyphenylenes.

In some embodiments, the precursor includes a B-staged organo polysilica dielectric matrix material. B-staged refers to uncured materials. In other words, under appropriate conditions, a B-staged organo polysilica material can be polymerized or cured, such as by condensation, to form higher molecular weight materials, such as coatings or films. Such B-staged material may be monomeric, oligomeric or mixtures thereof. B-staged material is further intended to include mixtures of polymeric material with monomers, oligomers or a mixture of monomers and oligomers.

In general, any reaction yielding the desired material from the precursor can be used. Naturally, the precursors and reaction mechanisms should be compatible with the chosen method of precursor delivery to the template. For example, when utilizing SCF or near SCF solutions low process temperatures (e.g., less than 250° C., 200° C., 150° C., or 100° C. for $CO_2$) and relatively high fluid densities (e.g., greater than 0.2 g/cm$^3$ for $CO_2$) in the vicinity of the template are important features. If the template temperature is too high, the density of the fluid in the vicinity of the substrate approaches the density of a gas, and the benefits of the solution-based process are lost. In addition, a high template temperature can adversely affect template morphology. For example, the reaction can involve reduction of the precursor (e.g., by using $H_2$ or $H_2S$ as a reducing agent), oxidation of the precursor (e.g., by using $O_2$ or $N_2O$ as an oxidizing agent), or hydrolysis of the precursor (i.e., adding $H_2O$). An example of a hydrolysis reaction is water (the reaction reagent) reacting with a metal alkoxide (the precursor), such as titanium tetraisopropoxide (TTIP), to produce a metal oxide structure, such as $TiO_2$. The reaction can also be initiated by optical radiation (e.g., photolysis by ultraviolet light). In this case, photons from the optical radiation are the reaction reagent.

In some cases, the precursor delivery agent can participate in the reaction. For example, in a supercritical solution including $N_2O$ as an additional solvent and metal precursors such as organometallic compounds, $N_2O$ can serve as an oxidizing agent for the metal precursors yielding metal oxides as the desired material. In most cases, however, the solvent in the SCF is chemically inert.

Post-Synthesis Treatment

The product of precursor delivery to the template is a composite (e.g., film or bulk layer) of the template material and the reaction product. The template material can be removed to yield a mesoporous structure of the reaction product. In such cases, the template material is usually decomposed, using one or more of a number of techniques. For example, a block copolymer template can be decomposed thermally, by calcination. Template removal from silica-polymer composites is well suited to calcination, as the decomposition temperature of most polymers (e.g., about 400° C.) will not affect the silica structure. Alternatively, the template can be decomposed or dissolved by chemical or photochemical techniques. The composite layer can be exposed to solvents or etchants that decompose the template, but not the reaction product. Photochemical techniques include the decomposition of the template by exposure to the appropriate radiation (e.g., ultraviolet radiation).

Decomposition of the template material can be performed in the presence of a fluid to facilitate template removal. In some cases, the precursor delivery agent can provide this function. For example, supercritical or near-supercritical $CO_2$ or $CO_2/O_2$ mixtures can exploit the transport advantages of SCFs in mesoporous materials to expedite removal of the decomposed template.

After template removal, the mesoporous material can be further treated as desired. In some embodiments, the mesoporous structure is chemically modified in a further process (or processes). For example, it can be necessary to modify the hydrophilic silica surface that is obtained from alkoxide condensation by reaction with 1,1,1,3,3,3-hexamethyldisilazane or $(CH_3)_3SiCl$ to cap dangling —OH groups and produce a hydrophobic surface. In many cases, this can be achieved using SCF $CO_2$ solutions of reagents. These reactions can include the use of commercial organosilane coupling agents including mono, di, and trifunctional coupling agents, such as those described in C. J. Brinker and G. W. Scherer, *Sol-Gel*

Science: the Physics and Chemistry of Sol-Gel Processing, Academic Press, San Diego Calif., 1999, p. 662.

Further treatment of the mesoporous material can also be performed in the presence of the precursor delivery agent, e.g., in the presence of a supercritical or near-supercritical fluid mixture (e.g., $CO_2$ or $CO_2/O_2$), thereby exploiting the transport advantages of SCFs in mesoporous materials.

In further embodiments, the mesoporous film is patterned after template removal. For example, the mesoporous film can be patterned using lithographic techniques, such as photolithography and electron beam lithography, as described above.

In some embodiments, a precursor is infused into the template, a reaction product is deposited within the template and the template/reaction product composite is processed further prior to removal of the template. In these embodiments, the presence of the template can impart beneficial mechanical properties for subsequent processing. For example, the template/reaction product composite can be patterned and etched prior to removal of the template to incorporate device structures. The template/reaction product composite can be etched to incorporate device features, materials can be deposited within those features and the deposited material can be planarized prior to removal of the template. Materials deposited within the features may include copper diffusion barriers and copper for the fabrication of interconnect structures for semiconductor devices, for example.

Applications

Mesoporous materials have several characteristics that make them attractive materials for numerous applications. For example, some mesoporous materials can have a low dielectric constant (e.g., less than about 2.5, 2.2, 2.0, 1.8, 1.5, or less), making them attractive dielectric materials in, e.g., integrated circuits and microelectronic devices. Alternatively, or additionally, mesoporous materials can have high hardness (e.g., hardness greater than about 0.1, 0.5, 0.7 GPa or more), making them attractive candidates for, e.g., protective, functional coatings. High hardness can also make a material more amenable to certain manufacturing processes, such as, for example in integrated circuit manufacture. Moreover, some mesoporous materials can have a low refractive index (e.g., a refractive index lower than about 1.4, 1.2, or lower), which makes them suitable for low index optical applications. Accordingly, mesoporous materials can be applied in the areas of low K dielectrics, catalysis, molecular separations, optical coatings, optoelectronics, photonics, and sensors, for example.

Mesoporous silica films are of interest to the microelectronics industry, e.g., in semiconductor device industry. In particular, because mesoporous films can have low dielectric constants, thin mesoporous films are potentially useful as low dielectric constant coatings on semiconductor wafers. In some embodiments, mesoporous films can be used as dielectric layers in integrated circuits, which can be made using standard techniques. Techniques for making integrated circuits are disclosed in *Semiconductor Manufacturing Technology*, by Michael Quirk and Julian Serda (Prentice Hall, 2001), for example.

Mesoporous materials can also be used to provide optical coatings on optical fibers and other optical components and devices. Mesoporous materials can provide a low refractive index layer, which makes them useful for anti-reflection coatings and other optical applications. Moreover, by adjusting the volume fraction of the pores in the mesoporous material, the material's refractive index can be selected to be any value within a range of values between the refractive index of the metal oxide and air. Alternatively, the pores may be filled with a fluid (e.g., a high refractive index fluid or a liquid crystal), and the materials refractive index selected to be within a range of values between the refractive index of the metal oxide and the fluid. Accordingly, the methods disclosed herein can be used to form mesoporous films on commercially available optical components (e.g., lenses, fibers, integrated optical components, and optical substrates such as glass substrates for electronic displays).

Mesoporous materials are also useful for catalysis and in molecular separations, and can be used in porous membranes.

EXAMPLES

The invention is further described in the following examples, which do not limit the scope of the invention described in the claims.

Chemicals

The block copolymers and non-ionic surfactants described herein are commercially available from BASF (Mt. Olive, N.J.) and Aldrich, and were used as received without further purification. Pluronic® F127 copolymers, which are triblock copolymers including poly(ethylene oxide) blocks on either side of a poly(propylene oxide) center block, were provided by BASF. Brij® 76 and Brij® 78 are oligomeric alkyl-poly (ethylene oxide) non-ionic surfactants and were obtained from Aldrich. The structures of the copolymer templates are as follows: Pluronic® F127 ($M_{Av}$=12,600) $EO_{106}PO_{70}EO_{106}$ (BASF); Brij® 76 $C_{18}EO_{10}$ (Aldrich); Brij® 78 $C_{18}EO_{20}$ (Aldrich). Poly(methacyrylic acid) ($M_{Av}$=100,000) was obtained from Polysciences. Tetraethylorthosilicate (TEOS) and p-toluene sulfonic acid (PTSA) were obtained from Acros Chemicals. Ethanol was obtained from Pharmco. Methyltriethoxysilane (MTES) and Bis(triethoxysilyl)ethane (BTESE) were obtained from Gelest. All chemicals were used as obtained without further purification. Carbon dioxide (Coleman grade) was obtained from Merriam-Graves and used as received. In-house deionized water was used for the infusions.

Example 1

Mesoporous Silica Film from TEOS

A silicon substrate (1.75 inch×1.75 inch) was cleaned in a mixture of ammonium hydroxide, deionized water and hydrogen peroxide (6:1:1 parts by volume), rinsed in deionized water, cleaned in a second solution of HCl, deionized water and hydrogen peroxide (6:1:1 parts by volume) and then rinsed in deionized water. A thin film of Pluronic® F127 was spin-cast on the cleaned silicon substrate using a four weight percent solution in ethanol containing a small amount of p-toluene sulfonic acid (PTSA) and water. After drying, the film containing PTSA was approximately 1500 Angstroms thick. The substrate with the spin-cast film was then placed into a high-pressure reactor. The reactor was constructed from opposed stainless steel blind hubs sealed with a metal seal ring (Grayloc). Machined ports were present on the blind hubs for the introduction and venting of the $CO_2$ and for monitoring the pressure and temperature inside the reactor. A rupture disc assembly, with a pressure rating below that of the reactor, was also present on the reactor for safety purposes. The temperature in the reactor was maintained constant using external band heaters (Watlow). The reactor was sealed and the film was exposed to a specific amount (5 microliters) of tetraethylorthosilicate (TEOS) in humidified carbon dioxide at 50° C. and 122 bar for 2 hours using a high pressure syringe pump (ISCO, Inc) that was maintained at 50° C. using a constant temperature bath. The inner temperature of the reactor was measured using an inner thermocouple and was maintained to ±2° C. using a combination of an externally mounted thermocouple and a temperature controller, which used external band heaters (Watlow) to heat the outer walls. The reactor was then slowly vented to atmospheric pressure. The composite film was then removed from the reactor and weighed. The mass of the film increased by 185 percent following the reaction.

The composite film was characterized by X-ray diffraction (XRD) with a Phillip PW3040-MPD diffractometer using the Cu-K$\alpha$ ray from the rotating anode in the $\theta$-$2\theta$ geometry ($2\theta$=0.5° to 6°, 0.005° step size, 40 second counting time).

FIG. 1 (bottom trace and bottom inset) shows a typical X-ray Diffraction (XRD) pattern of an as-infused mesostructured film of Pluronic® F127 infused with TEOS in supercritical carbon dioxide at 50° C. and 122.5 bar. It shows the presence of three strong reflections at $2\theta$ values between 0.5°-2° (with d spacings of 133.8 Å, 77.5 Å and 52 Å) in addition to other weak and shoulder peaks.

The Pluronic® F127 template was then removed from the composite films by heating the composite film in air from room temperature to 400° C. over a period of 6 hours, maintaining the sample at 400° C. in air for an additional 6 hours, and finally cooling from 400° C. to room temperature over 6 hours. Upon calcination of the mesostructured film at 400° C. for 6 hours, the XRD peaks shift to the right to higher values of $2\theta$ or lower d spacings, indicating slight shrinkage in the film (see FIG. 1 (top trace and top inset)). The intensity of the XRD peaks increases significantly due to increased electron density contrast from the removal of the template and the increased degree of polymerization of the silica network, also indicating that the mesostructure of the films is thermally stable (up to at least 400° C.). The XRD pattern of the calcined film shows three sharp peaks between $2\theta$=0.5°-2.5° with d spacings of 102.3 Å, 55.7 Å and 37.1 Å.

Figure 2B:
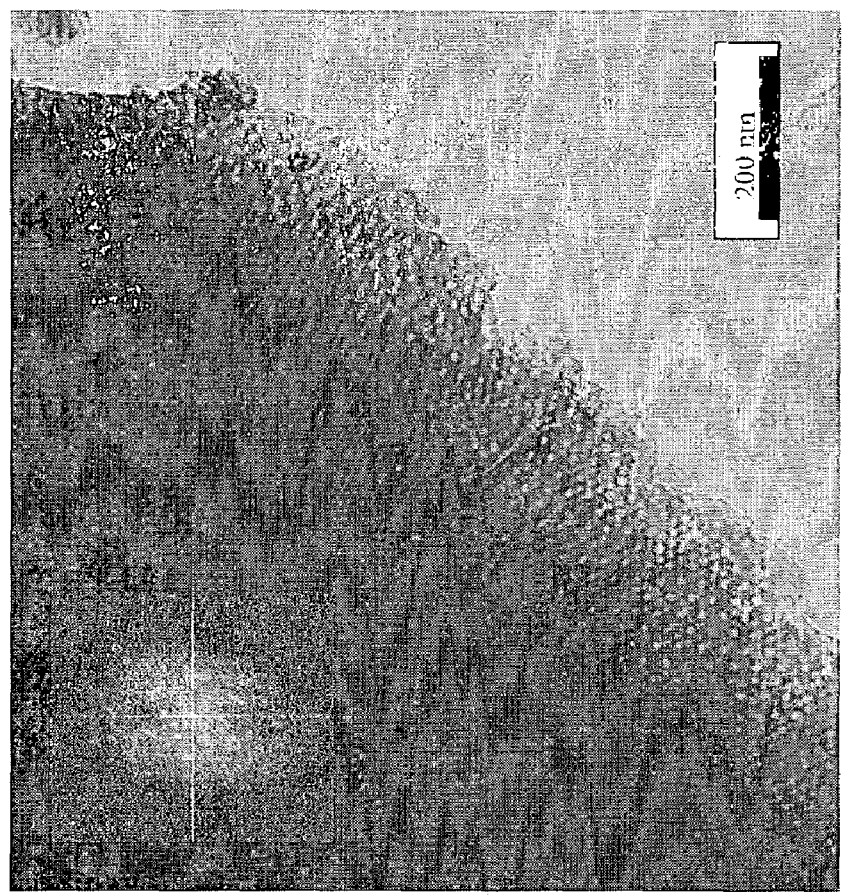
FIG. 2(a) and FIG. 2(b) are lattice images of the transmission electron micrographs for mesoporous material synthesized in Example 1.
Figure 2A:

The ordered nature of the film is evident in transmission electron microscopy images (TEM) shown in FIG. 2. The TEM images were taken on a JEOL 100CX electron microscope operating at 100 kV. The sample for the analysis was prepared by scraping the mesoporous film off the Si wafer, grinding the film into small particles and dispersing the particles onto a TEM grid using a slurry of particles in ethanol. TEM images and corresponding Fourier diffractograms indicated the near 3-D cubic structure of the calcined films. FIGS. 2(*a*) and 2(*b*) show the TEM images and the corresponding Fourier diffractograms for [100] and [111] incidences of a 3-D near cubic structure. The TEM images and the XRD patterns confirmed the presence of a 3-D cubic mesophase for the as-infused film and a 3-D near cubic mesophase for the calcined films.

Example 2

Mesoporous Silica Film from TEOS

A Silicon substrate (1.75 inch×1.75 inch) was cleaned using the procedure described in Example 1. Films of Pluronic® F127 were spin-cast on cleaned silicon substrates at 1500 rpm using a 12.5 wt. percent solution in ethanol containing a small amount of p-toluene sulfonic acid (PTSA) and water. After drying, the film containing PTSA was measured to be 8,095 Angstroms thick. The substrate was then placed into a high-pressure reactor, described in Example 1.

The reactor was sealed and the film was exposed to a 0.01 wt. percent solution of TEOS in humidified $CO_2$ at 60° C. and 122 bar for 4 hours using a high pressure syringe pump (ISCO, Inc), which was maintained at 60° C. using a constant temperature bath. The reactor was then slowly vented to atmospheric pressure. The composite film was then removed from the reactor and weighed. The mass of the film increased by 112 percent following the reaction.

Figure 3:
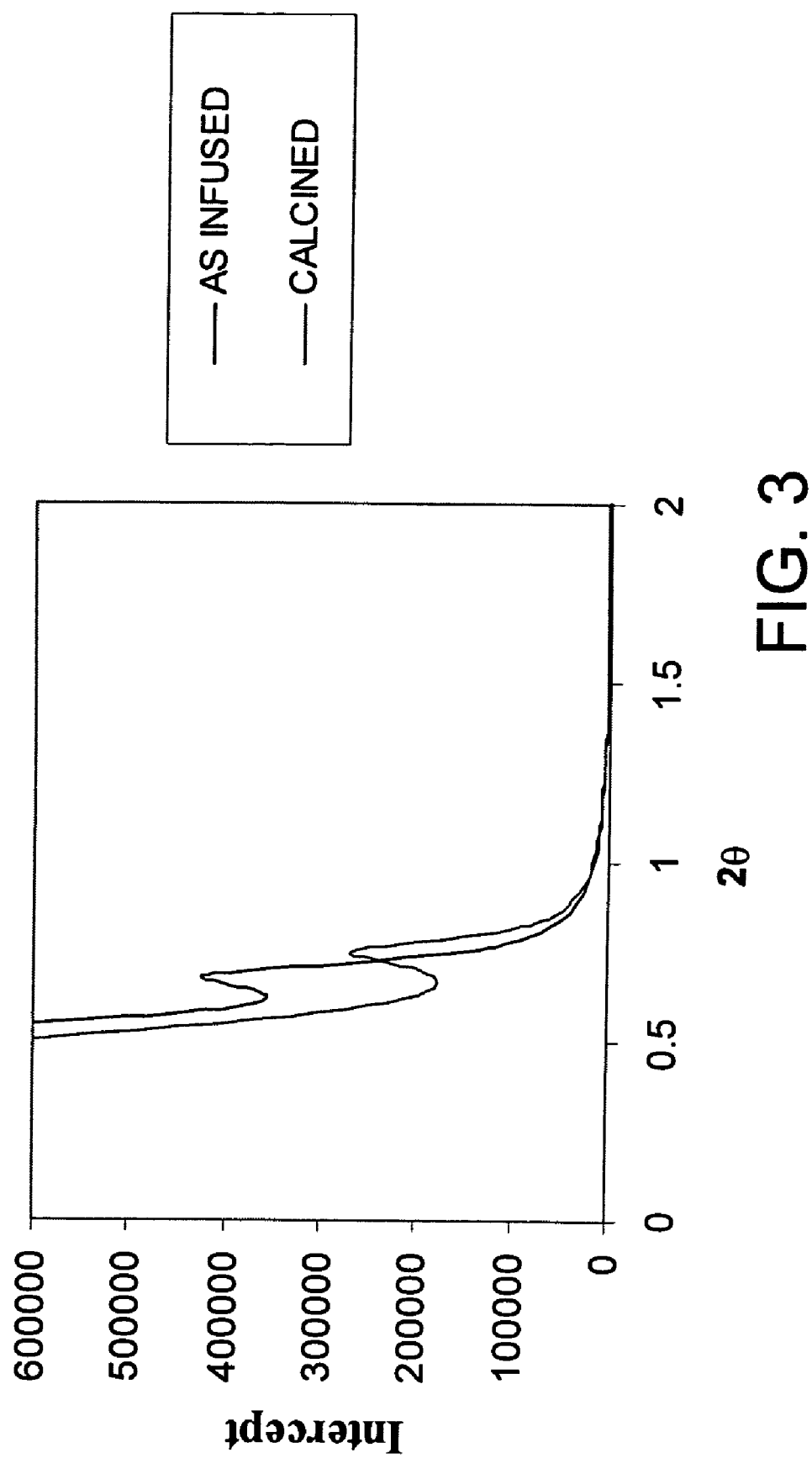
FIG. 3 is a set of X-ray Diffraction (XRD) patterns of a mesoporous film produced according to Example 2.

The composite film was characterized by X-ray diffraction using the Cu-K$\alpha$ ray from the rotating anode in the 0-$2\theta$ geometry (0.02° step, 40 second counting time). A sharp peak at a $2\theta$ of 0.68°, which corresponds to a d-spacing of 129.8 Angstroms, indicated a periodic structure had been produced (see FIG. 3). The peak was narrow with a half intensity width of less than 0.1°. The polymer template was then removed by calcination using the procedure described in Example 1. The calcined film was examined by XRD. After calcination, a contraction of the silica network was observed as the primary XRD peak shifted to 0.74°, which corresponds to a d-spacing of 119.3 Angstroms, as shown in FIG. 3. The analysis revealed that the contraction in this film was approximately 8.1 percent. By comparison, literature reports describing coordinated self-assembly of TEOS-surfactant structures indicate a contraction of 43 percent upon calcination as determined by XRD by measuring the movement of the 200 peak of the mesostructure (D. Grosso et al., *Chem. Mater.*, 13, 1848-1856 (2001)).

Figure 4:
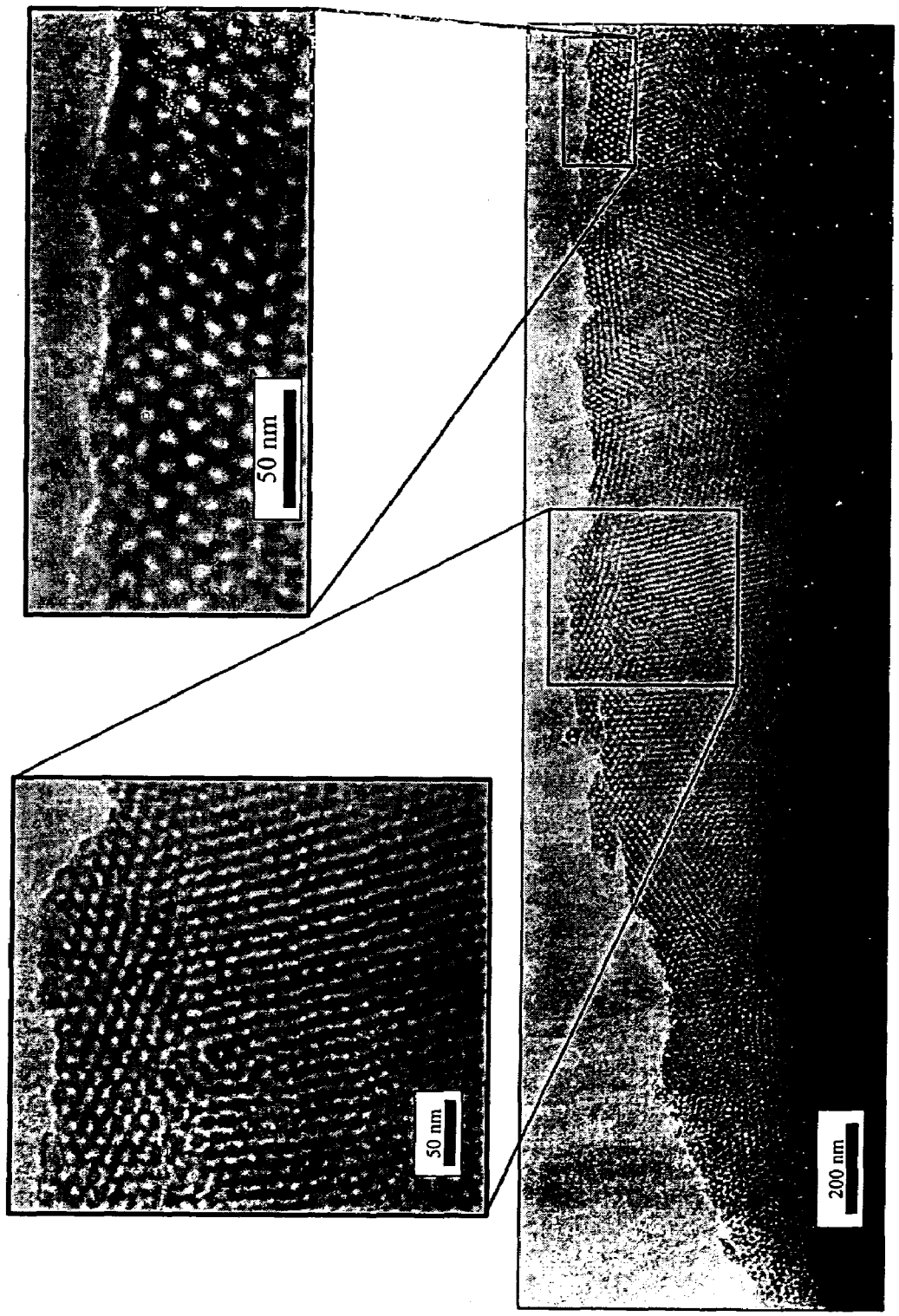
FIG. 4 is lattice image (with two portions enlarged) of the transmission electron micrographs for mesoporous material synthesized in Example 2.

The ordered nature of the film was evident from the transmission electro micrograph shown in FIG. 4. The sample for the analysis was prepared using the procedure described in Example 1. The image indicated that the ordered nature of the template had been preserved in the mesoporous films. The pores exhibited an ordered cylindrical morphology. Grains with cylinder orientations parallel to and perpendicular to the plane of the image were evident in the micrograph.

Example 3

Mesoporous Silica Film from TEOS and Brij® 76

A Silicon substrate (1.75 inch×1.75 inch) was cleaned using the procedure described in Example 1. A thin film of Brij® 76 was spin-cast on the cleaned silicon substrate using a five wt. percent solution in ethanol containing a small amount of p-toluene sulfonic acid (PTSA) and water. After drying, the film containing PTSA was approximately 1500 Angstroms thick. The substrate with the spin-cast film was then placed into a high-pressure reactor, which is similar to the one described in Example 1. The reactor was sealed and the Brij® 76 film was exposed to a specific amount (five microliters) of tetraethylorthosilicate (TEOS) in humidified carbon dioxide at 40° C. and 122 bar for 2 hours using a high pressure syringe pump (ISCO, Inc), which was maintained at 40° C. using a constant temperature bath. The inner temperature of the reactor was measured using an inner thermocouple and was maintained to ±2° C. using a combination of an externally mounted thermocouple and a temperature controller, which used external band heaters (Watlow) to heat the outer walls of the reactor. The reactor was then slowly vented to atmospheric pressure. The composite film was then removed from the reactor and weighed. The mass of the film increased by 157 percent following the reaction.

Figure 5:
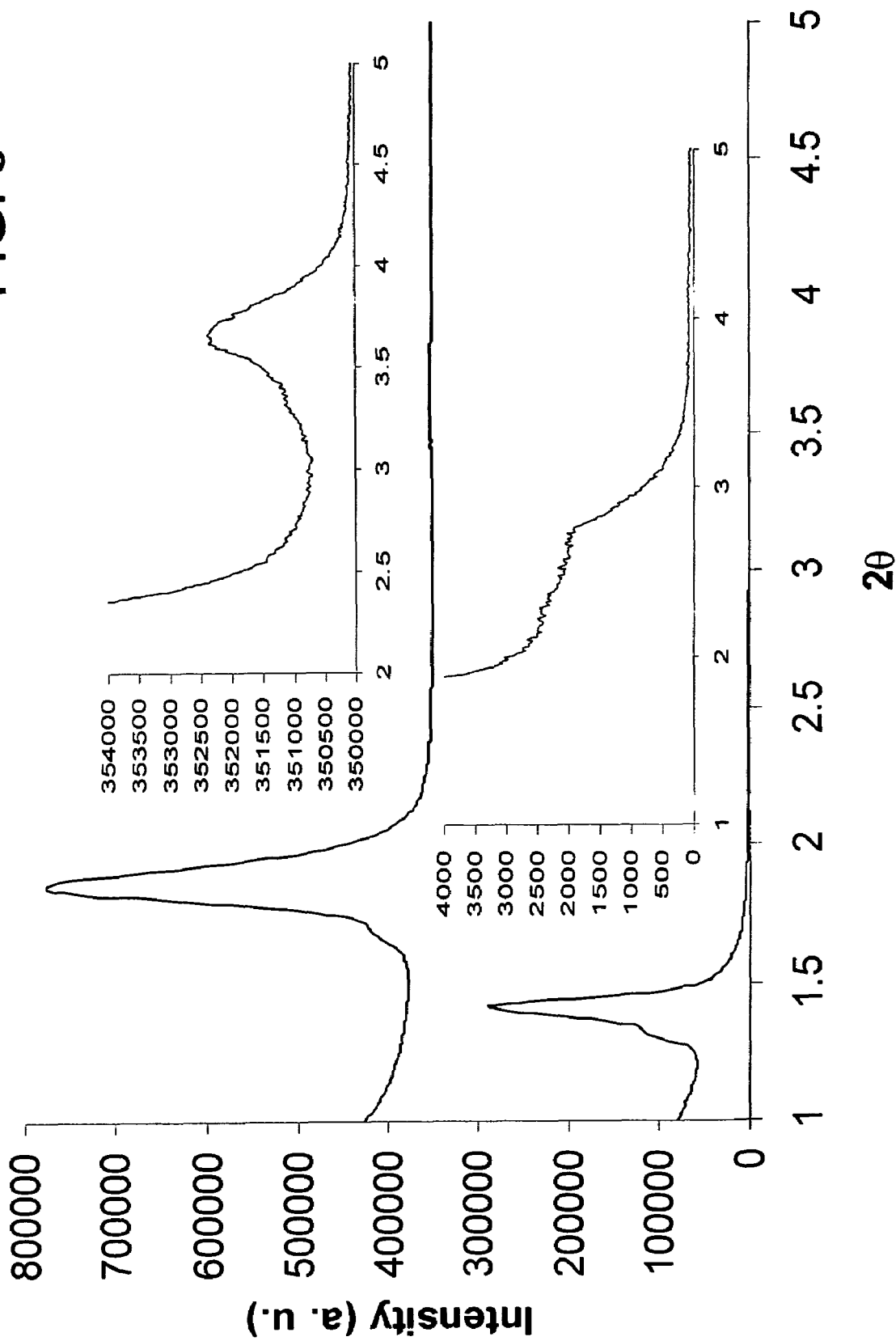
FIG. 5 is a set of X-ray Diffraction (XRD) patterns of a mesoporous film produced according to Example 3. The top trace (and top inset) shows the XRD pattern for the calcined film. The bottom trace (and bottom inset) shows the XRD pattern for the as-infused film.

FIG. 5 shows typical X-Ray Diffraction patterns for as-infused and calcined silicate films using non-ionic Brij® 76 surfactant as the template. The XRD pattern of the as-infused film that was infused with TEOS in supercritical $CO_2$ at 40° C. and 122.5 bar has three sharp peaks between $2\theta$ values between 1° and 3° (one sharp peak and two sharp shoulder peaks) corresponding to d spacings of 65.9 Å, 62.7 Å and 32.1 Å (see FIG. 5 (bottom trace and bottom inset)). Upon calcination, the peaks increase in intensity and shift to higher 2θ values corresponding to d spacings of 58.6 Å, 45.7 Å and 24.1 Å (FIG. 5 (top trace and top inset)). The XRD patterns of both the as-infused and calcined samples can be indexed as a 3-D hexagonal mesophase. The sharp XRD peaks of the as-infused film was indexed as the (100), (002) and (112) diffraction peaks of a 3-D hexagonal mesophase with unit cell parameters: a=76.2 Å and c=126 Å, c/a=1.653 (ideal c/a=1.632). After calcination at 400° C., the size of the unit cell contracts (a=59.7 Å and c=95.5 Å; c/a=1.6).

Figure 6B:
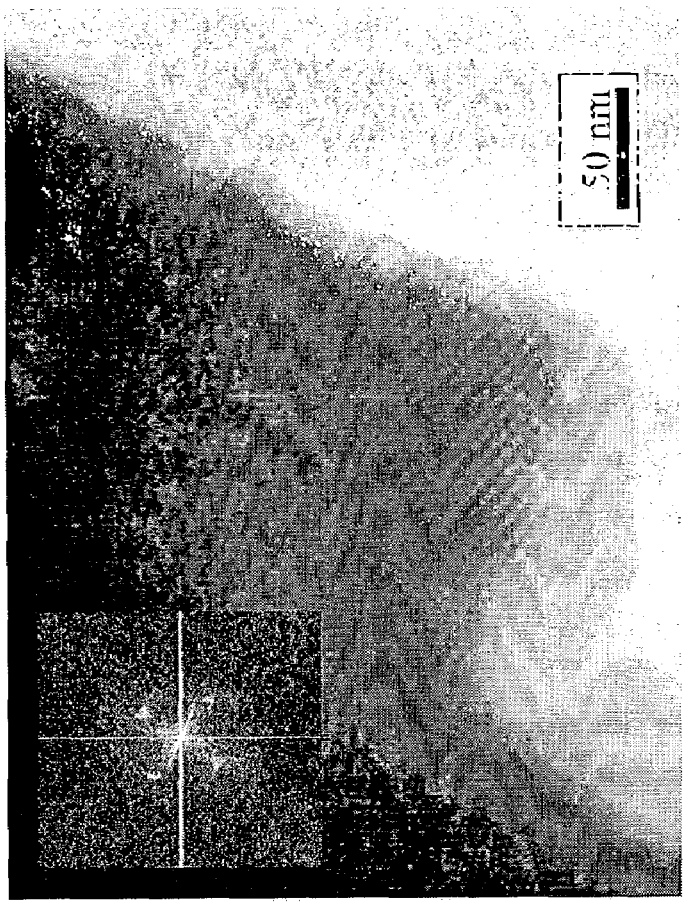
FIG. 6(a) and FIG. 6(b) lattice images of the transmission electron micrographs for mesoporous material synthesized in Example 3.
Figure 6A:
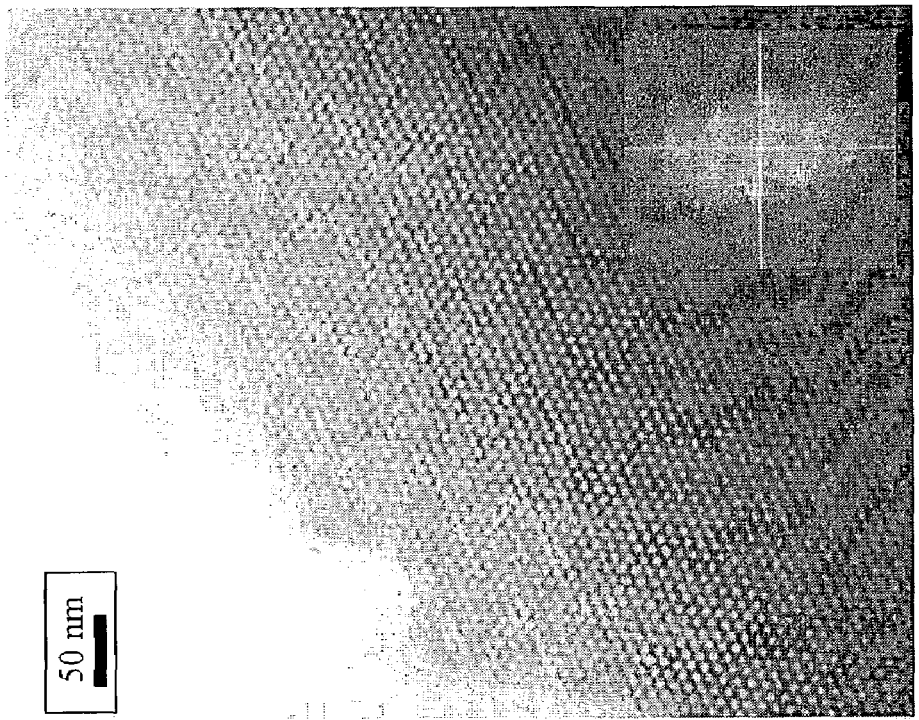

The calcined film was analyzed using Transmission Electron Microscopy (TEM). The samples for TEM were made using the procedure described in Example 1. FIGS. 6(a) and 6(b) respectively show TEM images of the 3-D hexagonal mesophase viewed along the [001] and [011] zone axis. The inset of these figures shows the corresponding Fourier diffractograms. Combining the XRD patterns along with the TEM images confirmed the 3-D hexagonal mesophase of the films.

Example 4

Mesoporous Silica Films from TEOS and Brij® 78

A Silicon substrate (1.75 inch×1.75 inch) was cleaned using the procedure described in Example 1. A thin film of Brij® 78 was spin-cast on the cleaned silicon substrate using a five wt. percent solution in ethanol containing a small amount of p-toluene sulfonic acid (PTSA) and water. After drying, the film containing PTSA was approximately 1700 Angstroms thick. The substrate with the spin-cast film was then placed into a high-pressure reactor, which is similar to the one described in Example 1. The reactor was sealed and the Brij® 78 film was exposed to a specific amount (five microliters) of tetraethylorthosilicate in humidified carbon dioxide at 60° C. and 122 bar for 2 hours using a high pressure syringe pump (ISCO, Inc). The high pressure syringe pump (ISCO, Inc) was maintained at 60° C. using a constant temperature bath. The inner temperature of the reactor was measured using an inner thermocouple and was maintained to ±2° C. using a combination of an externally mounted thermocouple and a temperature controller, which used external band heaters (Watlow) to heat the outer walls of the reactor. The reactor was then slowly vented to atmospheric pressure. The composite film was then removed from the reactor and weighed. The mass of the film increased by 162.5 percent.

Figure 7:
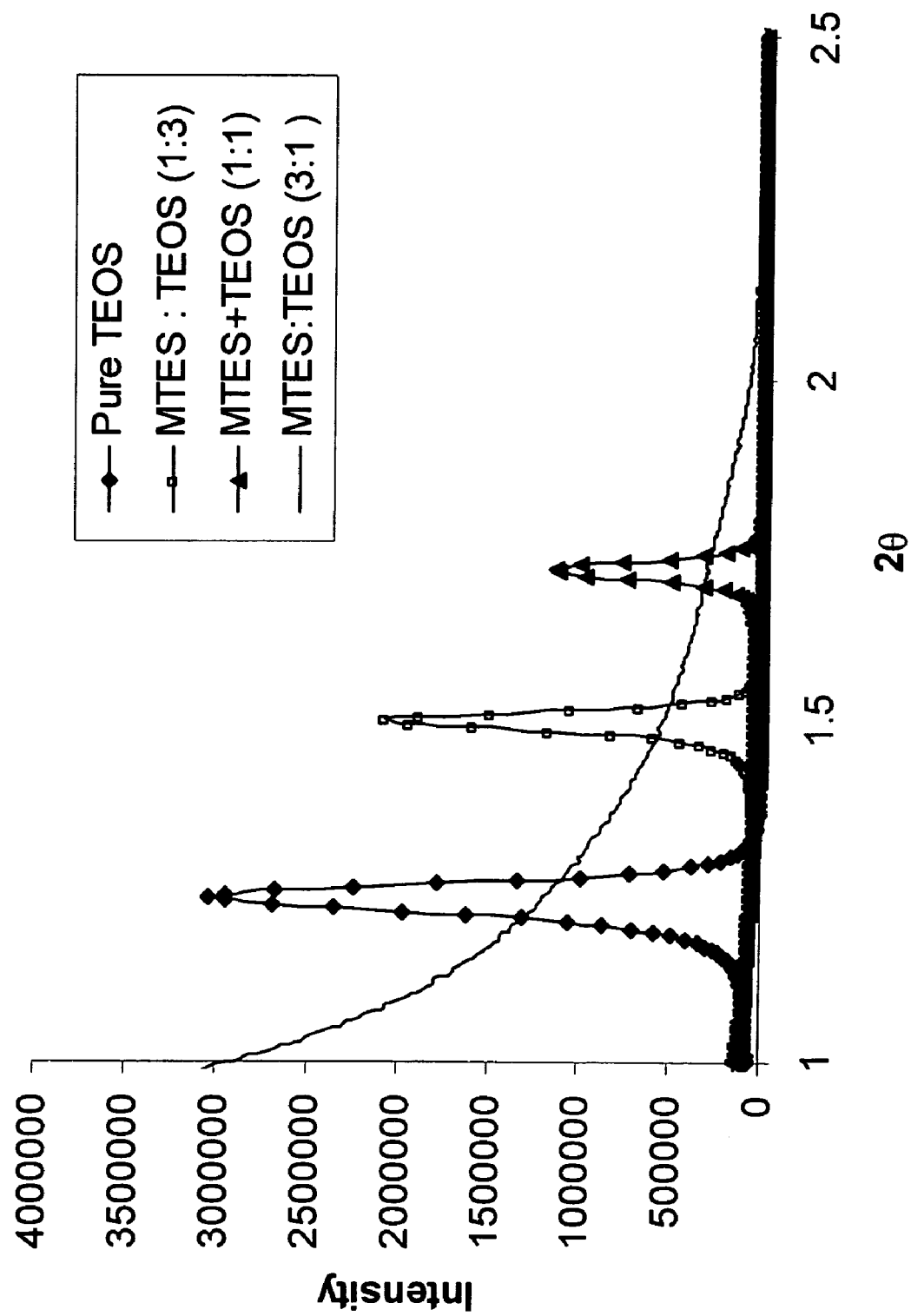
FIG. 7 is a set of X-ray Diffraction (XRD) patterns of as-infused films produced according to Examples 4, 5, 6 and 7, respectively.
Figure 8:
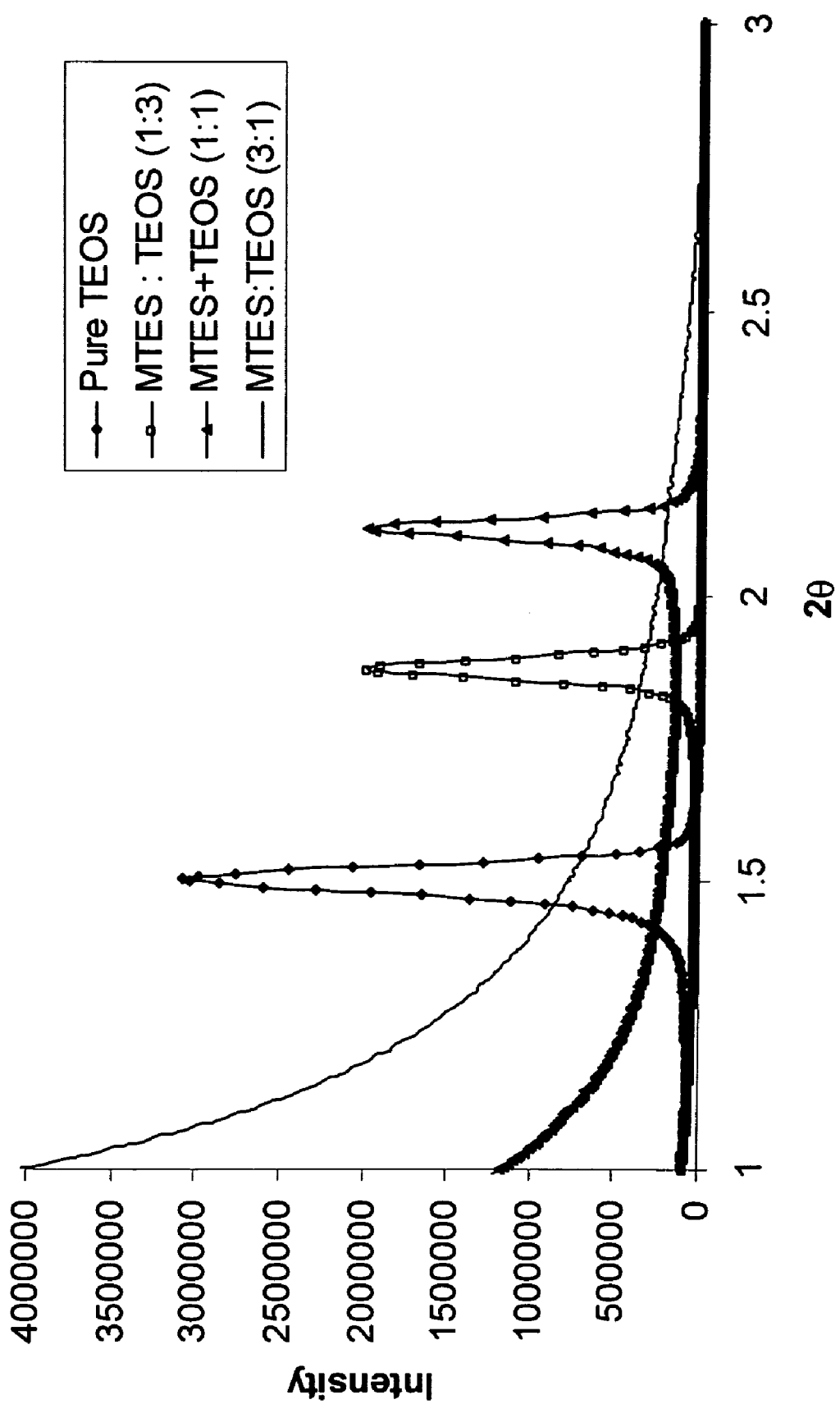
FIG. 8 is a set of X-ray Diffraction (XRD) patterns of calcined films produced according to Examples 4, 5, 6 and 7, respectively.

FIG. 7 shows the XRD pattern of the composite film after infusion with TEOS in humidified supercritical carbon dioxide at 60° C. and 122 bar. The XRD pattern of the same film after calcination is shown in FIG. 8. The XRD pattern of the as-infused composite film that was infused with TEOS in supercritical carbon dioxide at 60° C. and 122 bar has four sharp peaks (not shown in FIG. 7 due to the scale of the plot) corresponding to d spacings of 71.3 Å, 49.9 Å, 37 Å and 24.9 Å, in addition to other weaker reflections.

Figure 9B:
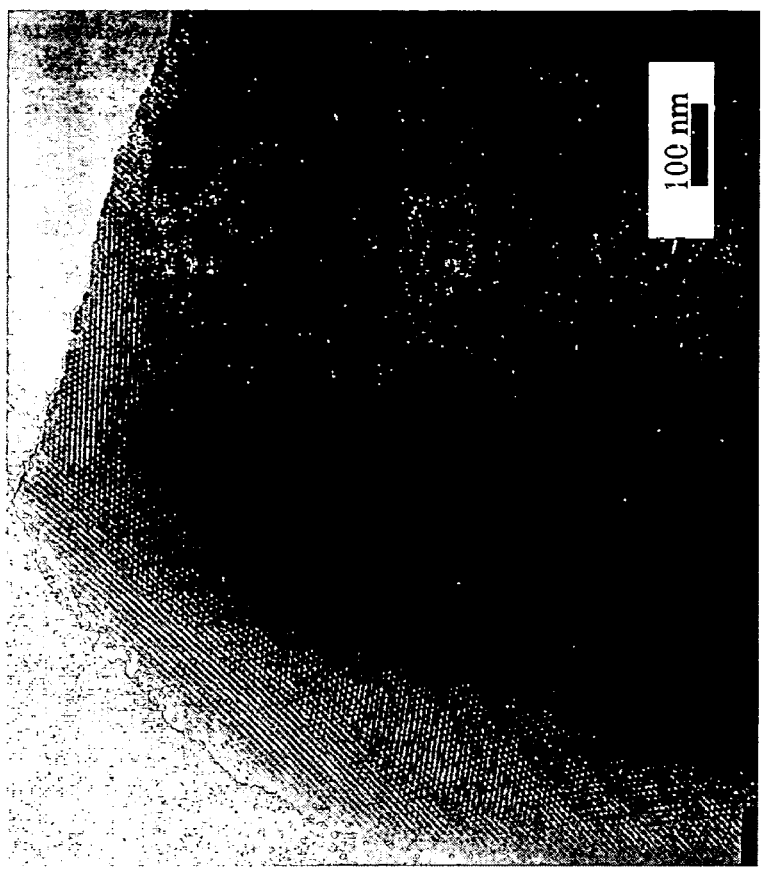
FIG. 9(a) and FIG. 9(b) are lattice images of the transmission electron micrographs for mesoporous material synthesized in Example 4.
Figure 9A:

The composite film was then calcined using the procedure described in Example 1. The XRD pattern of the calcined film shows two extremely sharp peaks (not shown in FIG. 8 due to the scale of the plot) corresponding to d spacings of 58.7 Å and 29.9 Å in addition to other weaker reflections. The sharp peaks in the XRD pattern of the as-infused film was indexed to the (110), (200), (220) and (400) diffraction peaks of a cubic mesophase (a=101.3 Å). The XRD peaks of the calcined was indexed to the (110) and (220) reflections of a cubic mesophase (a=82 Å). FIGS. 9(a) and 9(b) show TEM images of a calcined film that was infused at 50° C. and 122 bar. The sample for the TEM was prepared using the procedure described in Example 1. The TEM images show the cubic mesophase along the [100] and [111] directions.

Example 5

Mesoporous Organosilicate films from Mixtures of TEOS and Methyltriethoxysilane (MTES)

A Silicon substrate (1.75 inch×1.75 inch) was cleaned using the procedure described in Example 1. A thin film of Brij® 78 was spin-cast on the cleaned silicon substrate using a five wt. percent solution in ethanol containing a small amount of p-toluene sulfonic acid (PTSA) and water. After drying, the film containing PTSA was approximately 1700 Angstroms thick. The substrate with the spin-cast film was then placed into a high-pressure reactor, which is similar to the one described in Example 1. The reactor was sealed and the Brij(D 78 film was exposed to a specific amount (five microliters) of a (1:3 by weight) mixture of TEOS and methyltriethoxysilane in humidified carbon dioxide at 60° C. and 122 bar for 2 hours using a high pressure syringe pump (ISCO, Inc). The high pressure syringe pump (ISCO, Inc) was maintained at 60° C. using a constant temperature bath. The inner temperature of the reactor was measured using an inner thermocouple and was maintained to ±2° C. using a combination of an externally mounted thermocouple and a temperature controller, which used external band heaters (Watlow) to heat the outer walls of the reactor. The reactor was then slowly vented to atmospheric pressure. The composite film was then removed from the reactor and weighed. The mass of the film increased by 175 percent.

Figure 10B:
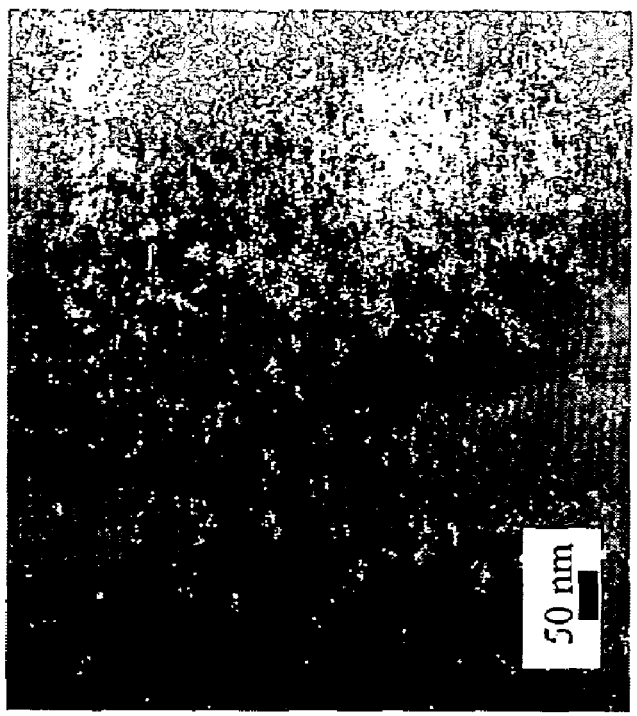
FIG. 10(a) and FIG. 10(b) are lattice images of the transmission electron micrographs for mesoporous material synthesized in Example 5.
Figure 10A:
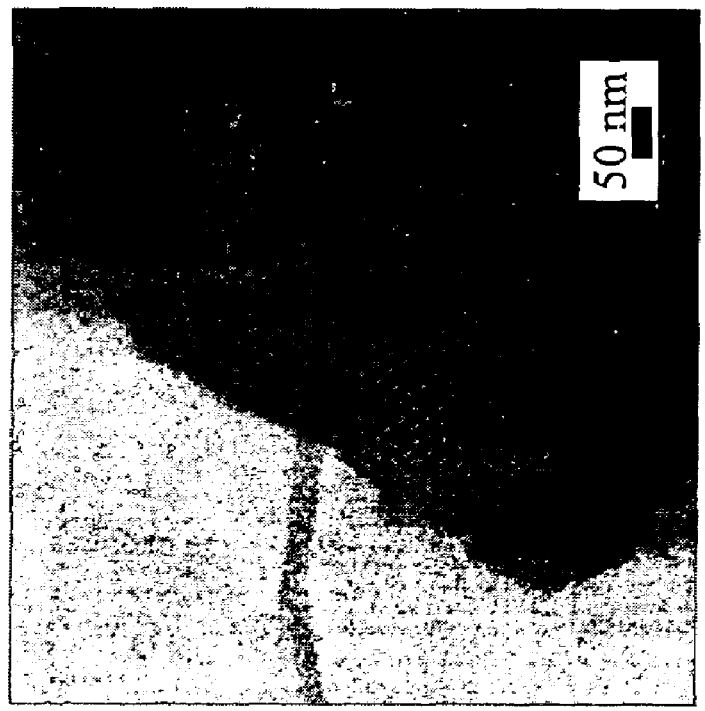

FIG. 7 shows the XRD pattern of the composite film after infusion, while the XRD pattern of the same film after calcination is shown in FIG. 8. The XRD pattern of the as-infused film that was infused with a (1:3) mixture of MTES and TEOS in supercritical carbon dioxide at 60° C. and 122 bar has a single sharp peak corresponding to the d spacing of 54 Å. On calcination by the procedure described in Example 1, the XRD shows a sharp peak for a d spacing of 41.7 Å. TEM images of the calcined sample are shown in FIGS. 10(a) and 10(b) and indicated a 2D hexagonal array of cylinders as the resulting mesophase. The Bragg peak for the as-infused film was indexed as the (100) reflection, while the sharp peak for the calcined film was indexed as the (100) reflection of the 2D hexagonal mesophase.

Example 6

Mesoporous Organosilicate Films from Mixtures of TEOS and Methyltriethoxysilane (MTES)

A Silicon substrate (1.75 inch×1.75 inch) was cleaned using the procedure described in Example 1. A thin film of Brij® 78 was spin-cast on the cleaned silicon substrate using a five wt. percent solution in ethanol containing a small amount of p-toluene sulfonic acid (PTSA) and water. After drying, the film containing PTSA was approximately 1700 Angstroms thick. The substrate with the spin-cast film was then placed into a high-pressure reactor, which is similar to the one described in Example 1. The reactor was sealed and the Brij® 78 film was exposed to a specific amount (five microliters) of a (1:1 by weight) mixture of TEOS and methyltriethoxysilane in humidified carbon dioxide at 60° C. and 122 bar for 2 hours using a high pressure syringe pump (ISCO, Inc). The high pressure syringe pump (ISCO, Inc) was maintained at 60° C. using a constant temperature bath. The inner temperature of the reactor was measured using an inner thermocouple and was maintained to ±2° C. using a combination of an externally mounted thermocouple and a temperature controller, which used external band heaters (Watlow) to heat the outer walls of the reactor. The reactor was then slowly vented to atmospheric pressure. The composite film was then removed from the reactor and weighed. The mass of the film increased by 175 percent.

Figure 11B:
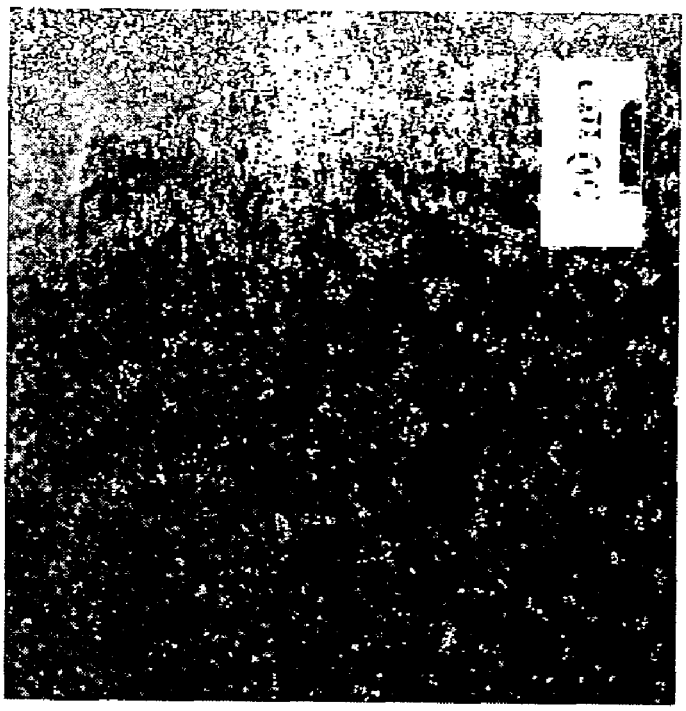
FIG. 11(a) and FIG. 11(b) are lattice images of the transmission electron micrographs for mesoporous material synthesized in Example 6.
Figure 11A:
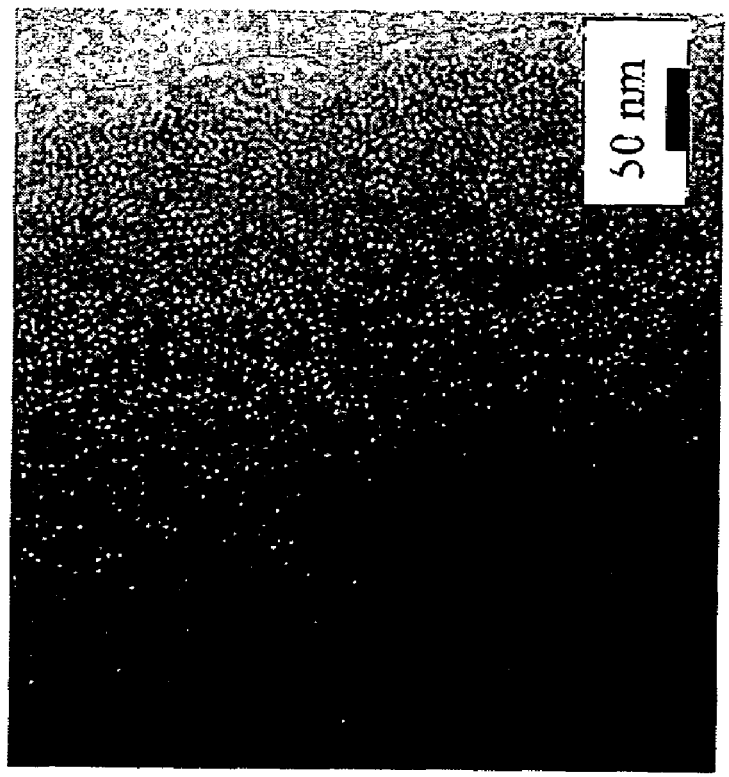

FIG. 7 shows the XRD pattern of the composite film after infusion, while the XRD pattern of the same film after calcination is shown in FIG. 8. For the composite film that was infused with a (1:1 by weight) mixture of MTES and TEOS in humidified carbon dioxide at 60° C. and 122 bar, the XRD pattern shows a sharp peak for a d spacing of 54 Å. The XRD pattern of the same film after calcination using the procedure described in Example 1 shows a couple of strong reflections for d spacings of 47.1 Å and 24 Å (not shown in FIG. 8 due to the scale). TEM images for the calcined sample are shown in FIGS. 11(a) and 11(b). TEM images of the calcined sample indicates a 2D hexagonal disordered mesophase for the sample. The Bragg peak for the as-infused film was indexed as the (100) reflection, while the Bragg peaks for the calcined film was indexed as the (100) and (200) reflections of the 2D hexagonal disordered mesophase.

Example 7

Mesoporous Organosilicate Films from Mixtures of TEOS and Methyltriethoxysilane (MTES)

A Silicon substrate (1.75 inch×1.75 inch) was cleaned using the procedure described in Example 1. A thin film of Brij® 78 was spin-cast on the cleaned silicon substrate using a five wt. percent solution in ethanol containing a small amount of p-toluene sulfonic acid (PTSA) and water. After drying, the film containing PTSA was approximately 1700 Angstroms thick. The substrate with the spin-cast film was then placed into a high-pressure reactor, which is similar to the one described in Example 1. The reactor was sealed and the Brij® 78 film was exposed to a specific amount (five microliters) of a (3:1 by weight) mixture of TEOS and methyltriethoxysilane in humidified carbon dioxide at 60° C. and 122 bar for 2 hours using a high pressure syringe pump (ISCO, Inc). The high pressure syringe pump (ISCO, Inc) was maintained at 60° C. using a constant temperature bath. The inner temperature of the reactor was measured using an inner thermocouple and was maintained to 12° C. using a combination of an externally mounted thermocouple and a temperature controller, which used external band heaters (Watlow) to heat the outer walls of the reactor. The reactor was then slowly vented to atmospheric pressure. The composite film was then removed from the reactor and weighed. The mass of the film increased by 162.5 percent.

FIG. 7 shows the XRD pattern of the composite film after infusion, while the XRD pattern of the same film after calcination is shown in FIG. 8. For the composite film that was infused using a (3:1 by weight) mixture of MTES and TEOS in humidified carbon dioxide at 60° C. and 122 bar, the XRD patterns of the as-infused shows a weak shoulder peak for a d spacing of 48.8 Å. On calcination, the XRD pattern of the calcined film shows a sole shoulder peak at d spacing of ~38.4 Å. The presence of a sole weak shoulder peak indicates a disordered mesophase.

Example 8

Silica Mesoporous Film from TEOS

A high resistance 100 μm-thick (100) silicon substrate (1 cm×1 cm) obtained from International Wafer Service was cleaned using the procedure described in Example 1. Thin films of Pluronic® F127 were spin-cast on cleaned silicon substrates at 1500 rpm using 12.5 wt. percent solution in ethanol containing a small amount of p-toluene sulfonic acid (PTSA) and water. After drying, the film containing PTSA was measured to be 8095 Angstroms thick. The film was then placed into high-pressure stainless steel tubular reactor (High-Pressure Equipment) sealed with a stainless steel end plug at one end and a needle valve at the other end. The reactor was sealed and the film was exposed to a 0.095 wt. percent solution of TEOS in humidified $CO_2$ at 40° C. and 122 bar for 2 hours using a high pressure syringe pump (ISCO, Inc) that was maintained at 40° C. using a constant temperature bath. The temperature of the reactor was kept constant by immersing the reactor vessel in a circulating constant temperature water bath. The reactor was then slowly vented to atmospheric pressure. The polymer template was then removed by calcination using the procedure described in Example 1. The film was characterized using Small Angle X-ray Scattering (SAXS) after the infusion and again after the calcination process.

Figure 12A:
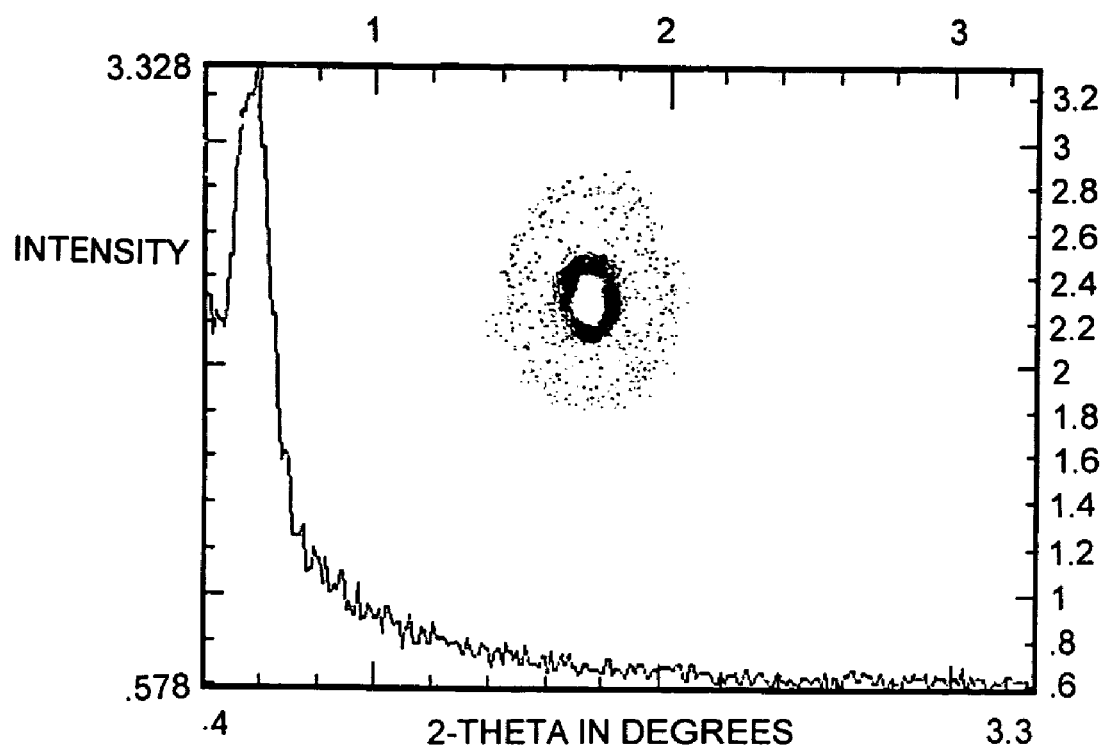
FIG. 12(a) and FIG. 12(b) are SAXS profile snapshots of a mesoporous silica film produced according to Example 8.
Figure 12B:
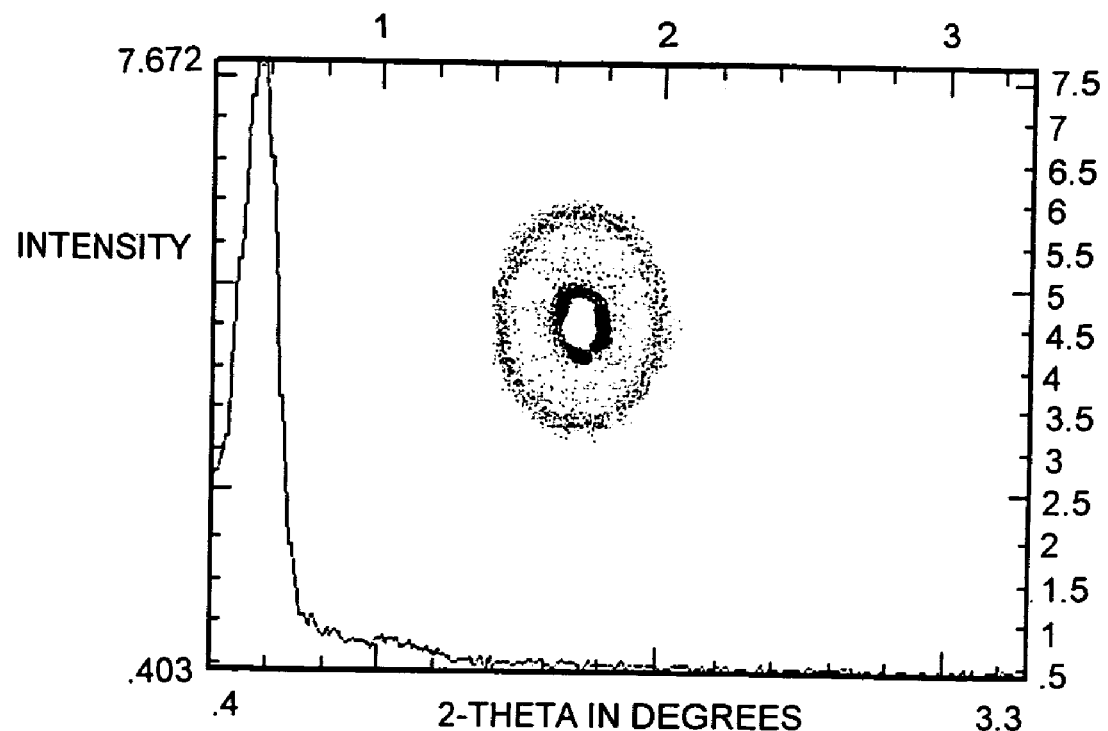
Figure 13:
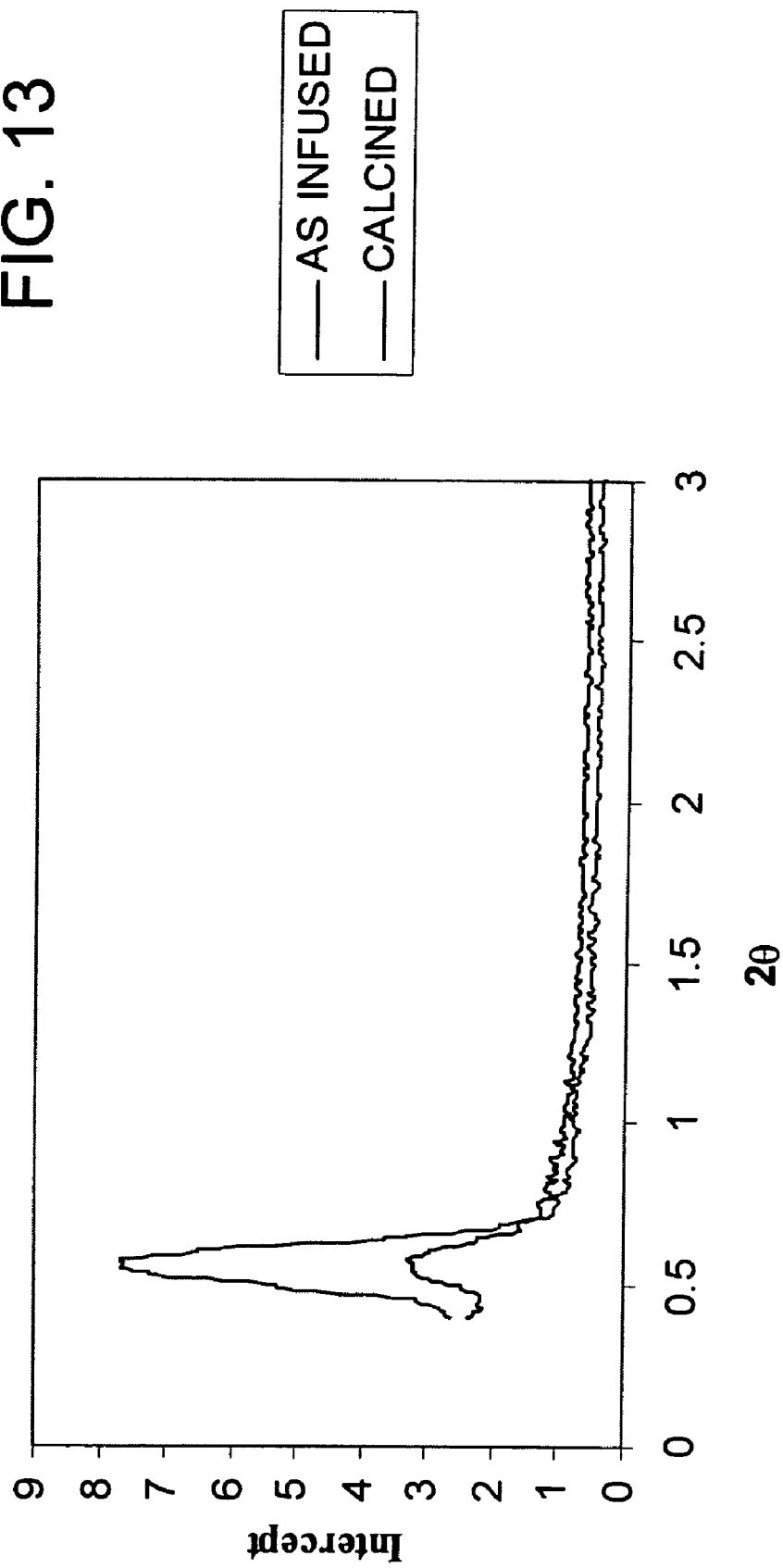
FIG. 13 is a set of integrated SAXS profiles of a mesoporous film produced according to Example 8.

FIGS. 12(a) and 12(b) show snapshots of SAXS profiles obtained for the as-infused and calcined films in the transmission mode with normal beam geometry configuration (i.e., with the incident beam normal to the sample surface). Referring to FIG. 13, which shows the integrated SAXS profile as a function of 2θ, no shift in the primary peak was observed in the SAXS image, indicating no contraction in the inorganic silica network. Both the SAXS scans give a peak at nearly the same 2θ value (2θ=0.58°) with a peak width of <0.2°. This corresponds to a d spacing of 152 Angstroms. No higher order peaks were observed in the SAXS.

Example 9

Mesoporous Silica from a Bridged Silsesquioxane Precursor

A Silicon substrate (1.75 inch×1.75 inch) was cleaned using the procedure described in Example 1. A thin film of Pluronic® F127 was spin-cast on the cleaned silicon substrate using the solution described in Example 1. After drying, the film containing PTSA was approximately 1500 Angstroms thick. The substrate with the spin-cast film was then placed into a high-pressure reactor, as described in Example 1. The reactor was sealed and the film was exposed to a specific amount (10 microliters) of a bridged silsesquioxane, bis(triethoxysilyl)ethane (BTESE) in humidified carbon dioxide at 60° C. and 122 bar for 2 hours using a high pressure syringe pump (ISCO, Inc) that was maintained at 60° C. using a constant temperature bath. The reactor was then slowly vented to atmospheric pressure. The composite film was then removed from the reactor and weighed. The mass of the film increased by 225 percent following the reaction.

Figure 14:
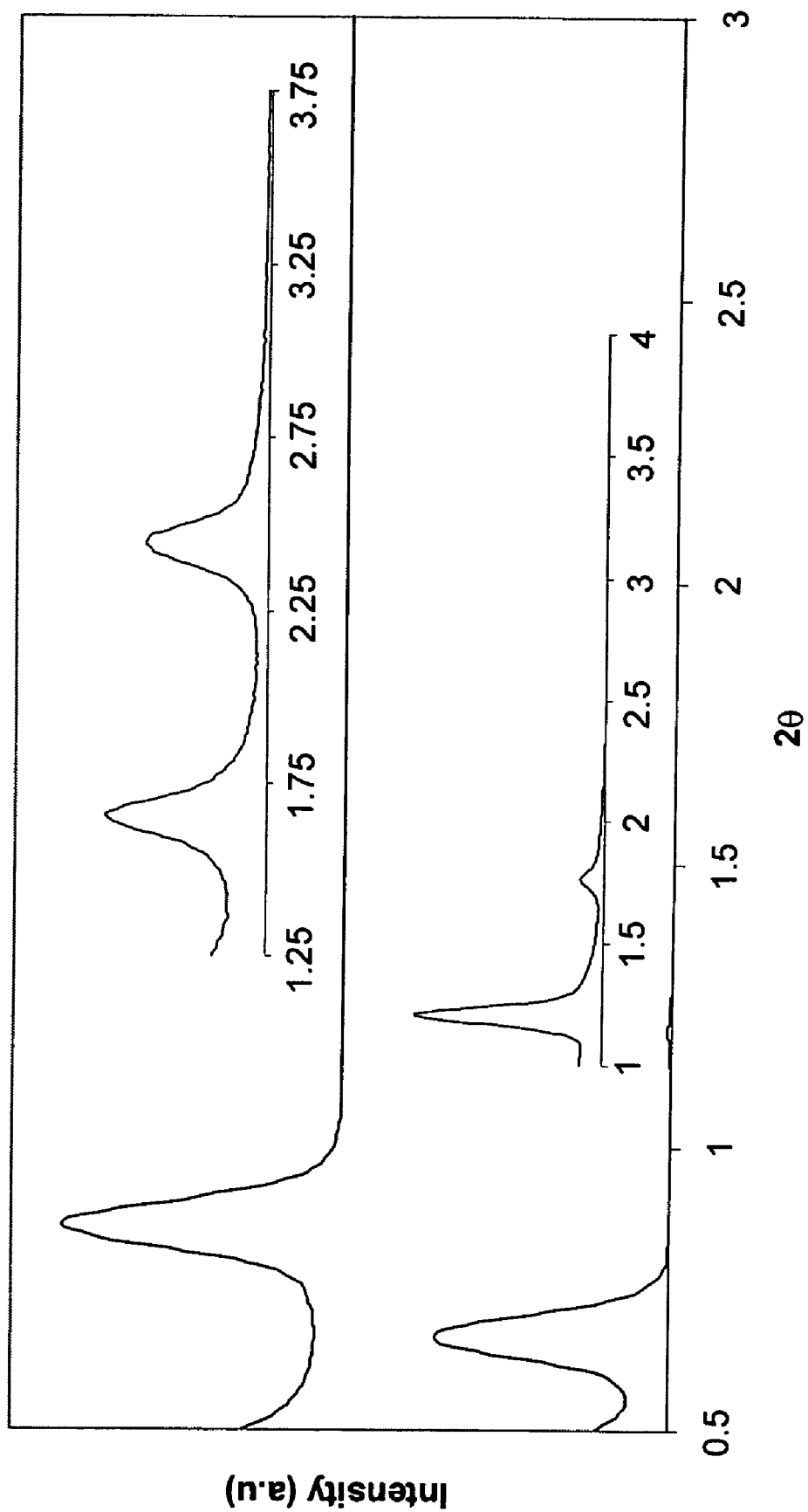
FIG. 14 is a set of X-ray Diffraction (XRD) patterns of mesoporous film produced according to Example 9.
Figure 15B:
FIG. 15(a) and FIG. 15(b) are lattice images of the transmission electron micrographs for mesoporous material synthesized in Example 9.
Figure 15A:

The XRD pattern of the as-infused composite film has sharp reflections corresponding to d spacings of 131.9 Å, 73.6 Å and 50.2 Å, as shown in FIG. 14 (bottom trace and bottom inset trace). Upon calcination using the procedure described in Example 1, the XRD pattern showed sharp reflections at higher values of 2θ or smaller d spacings of 102.7 Å, 53.5 Å and 36.2 Å (see FIG. 14 (top trace and top inset trace)). The sharp reflections of the as-infused composite film was indexed to the (002), (200), and (204) reflections of a 2D centered rectangular array of cylinders (a=146.6 Å, c=264 Å, c/a=1.8). The Bragg peaks for the calcined film were indexed as the (002), (200) and (204) reflections of a 2D centered rectangular array of cylinders (a=109 Å, c=205 Å, c/a=1.88). Referring to FIGS. 15(*a*) and 15(*b*), TEM images of the calcined sample and the corresponding Fourier diffractograms show the 2D centered rectangular array of cylinders.

Example 10

Mesoporous Silica Film from a Mixture of Methyltriethoxysilane (MTES) and TEOS

A low resistivity Silicon substrate (1.75 inch×1.75 inch) was cleaned using the procedure described in Example 1. A film of Pluronic® F127 was spin-cast on the cleaned silicon substrate using the solution described in Example 1. After drying, the film containing PTSA was approximately 7000 Angstroms thick. The substrate with the spin-cast film was then placed into a high-pressure reactor, as described in Example 1. The reactor was sealed and the film was exposed to a specific amount (10 microliters) of a (2:3 by weight) mixture of methyltriethoxysilane and TEOS in humidified carbon dioxide at 60° C. and 122 bar for 2 hours using a high pressure syringe pump (ISCO, Inc) that was maintained at 60° C. using a constant temperature bath. The reactor was then slowly vented to atmospheric pressure. The composite film was then removed from the reactor and weighed. The mass of the film increased by 125 percent following the reaction.

Figure 16:
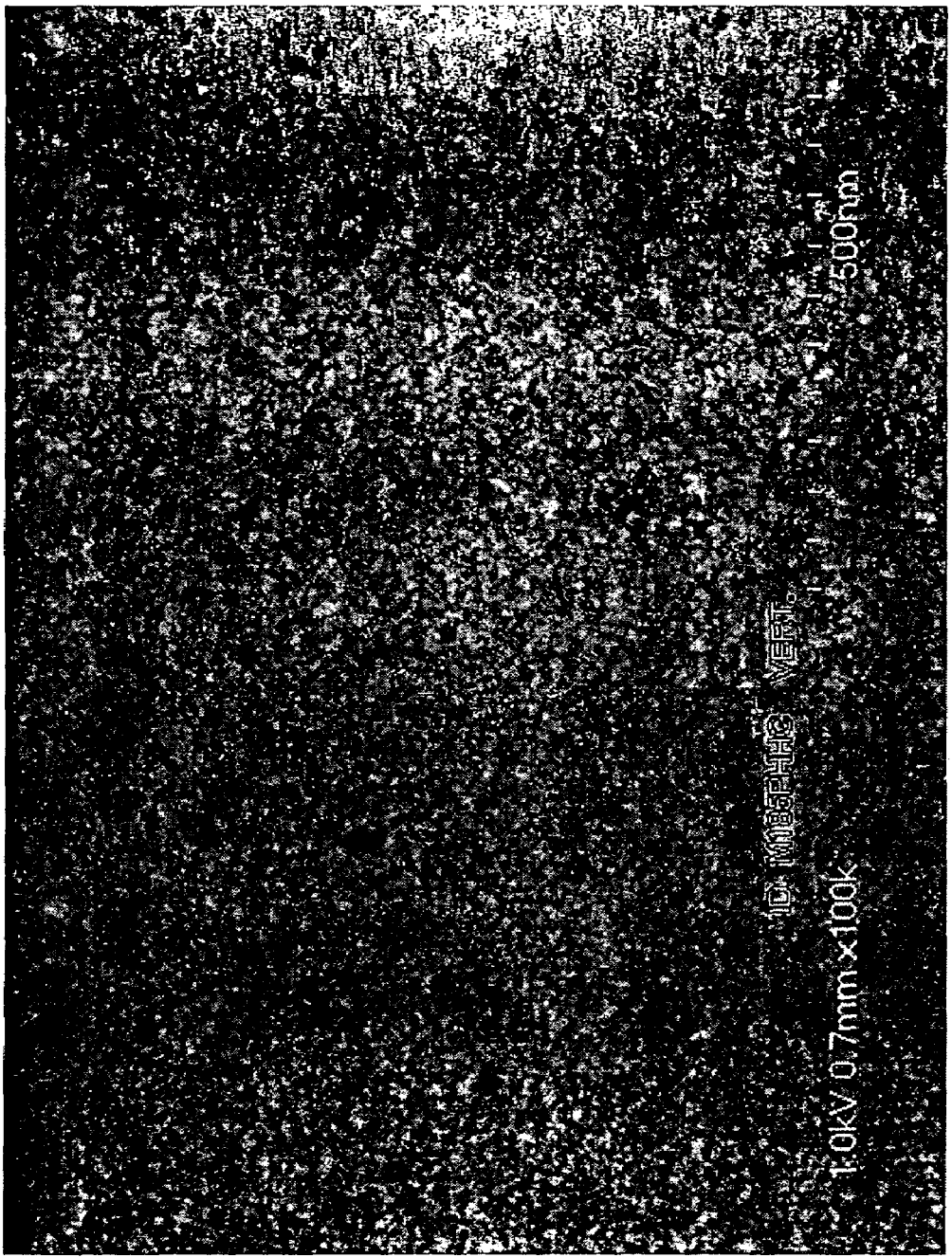
FIG. 16 is a cross-sectional scanning electron microscope image for mesoporous film synthesized in Example 10.

The template was removed and the residual silanols in the film were capped by reaction with hexamethydisilazane (HMDS). The resulting film had a dielectric constant of 2.11 and a hardness of 0.75 GPa. Scanning Electron Microscopy was performed on a cross section of the sample using. FIG. 16 shows a cross-sectional SEM image of the sample, and illustrates the porous nature of the film.

Example 11

Using a Cold-Wall Reactor

A silicon substrate is cleaned using the procedure described in Example 1. A thin film of Pluronic® F127 is spin-cast onto the substrate at 1500 rpm using a 12.5 wt. percent solution in ethanol containing a small amount of p-toluene sulfonic acid (PTSA) and water. The substrate is then placed into a high-pressure, cold wall reactor. The reactor is constructed of two opposing blind hubs that contain ports for measuring temperature and pressure, for transferring $CO_2$ and reagents and for connection to safety relief devices. The reactor also contains a resistively heated stage that supports the sample. The temperature of the stage can be controlled independently of the reactor walls. The reactor is sealed using a metal seal ring and the Pluronic® film containing the catalyst is annealed in neat supercritical $CO_2$ to promote order and is then exposed to a 0.03 wt. percent solution of TEOS in humidified $CO_2$ at 60° C. and 124 bar for two hours. The reactor wall temperature is maintained at 60° C. and the stage temperature is then raised to 120° C. for an additional hour. The reactor is then slowly vented to atmospheric pressure and the composite film is removed. The polymer template is removed by calcination in an oven by heating from room temperature to 400° C. over a period of 6 hours and then maintaining the sample at 400° C. for an additional 6 hours.

Example 12

Using a Cold-Wall Reactor Using a Different Processing Schedule

A silicon substrate is cleaned using the procedure described in Example 1. A thin film of Pluronic® F127 is spin-cast onto the substrate at 1500 rpm using a 12.5 wt. percent solution in ethanol containing a small amount of p-toluene sulfonic acid (PTSA) and water. The substrate is then placed onto the heated stage in the high-pressure, cold wall reactor described in Example 4. The reactor is sealed using a metal seal ring. The stage is heated to 120° C. and the wall of the reactor is maintained at 50° C. The substrate-supported Pluronic® film containing the catalyst is then exposed to a 0.03 wt. percent solution of TEOS in humidified $CO_2$ for one hour. The reactor is then slowly vented to atmospheric pressure and the composite film is removed from the oven. The polymer template is then removed by calcination in an oven by heating from room temperature to 400° C. over a period of 6 hours and then maintaining the sample at 400° C. for an additional 6 hours.

Example 13

Using a Cold-Wall Reactor in which the Template is Removed In-Situ

A silicon substrate is cleaned using the procedure described in Example 1. A thin film of Pluronic® F127 is spin-cast onto the substrate at 1500 rpm using a 12.5 wt. percent solution in ethanol containing a small amount of p-toluene sulfonic acid (PTSA) and water. The substrate is then placed onto the heated stage in the high-pressure, cold wall reactor described in Example 4. The reactor is sealed using a metal seal ring and the Pluronic® film containing the catalyst is exposed to a 0.03 wt. percent solution of TEOS, in humidified $CO_2$ at 60° C. and 124 bar for two hours. The stage temperature is then raised to 400° C. to remove the polymer template. The reactor is then slowly vented to atmospheric pressure.

Example 14

Using a Cold-Wall Reactor in which the Template is Removed In-situ in a Two-Step Process A silicon substrate is cleaned using the procedure described in Example 1. A thin film of Pluronic® F127 is spin-cast onto the substrate at 1500 rpm using a 12.5 wt. percent solution in ethanol containing a small amount of p-toluene sulfonic acid (PTSA) and water. The substrate is then placed onto the heated stage in the high-pressure, cold wall reactor detailed in Example 4. The reactor is sealed using a metal seal ring and the Pluronic® film containing the catalyst is exposed to a 0.03 wt. percent solution of TEOS, in humidified $CO_2$ at 60° C. and 124 bar for two hours. The reactor is then vented and purged with $CO_2$. The reactor is then filled with a mixture of a trace amount of oxygen in $CO_2$ and heated to 60° C. The stage temperature is then raised to 400° C. to decompose the polymer template. The reactor is then slowly vented to atmospheric pressure.

Example 15

Using a Cold-Wall Reactor in which the Template is Removed In-Situ and a Porous Substrate is Modified by Chemical Reaction A silicon substrate is cleaned using the procedure described in Example 1. A thin film of Pluronic® F127 is spin-cast onto the substrate at 1500 rpm using a 12.5 wt. percent solution in ethanol containing a small amount of p-toluene sulfonic acid (PTSA) and water. The substrate is then placed onto the heated stage in the high-pressure, cold wall reactor described in Example 4. The reactor is sealed using a metal seal ring and the Pluronic®) film containing the catalyst is exposed to a 0.03 wt. percent solution of TEOS, in humidified $CO_2$ at 60° C. and 124 bar for two hours. The stage temperature is then raised to 400° C. to degrade the polymer template. The reactor is then purged with $CO_2$ and the stage is cooled to 60° C. A solution of $(CH_3)_3SiCl$ and $CO_2$ is introduced into the reactor and the temperature is raised to 160° C. The reaction renders the pore surface hydrophobic. The reactor is then slowly vented to atmospheric pressure.

Example 16

Using a Different Template

A silicon wafer is cleaned as described in Example 1. A thin film of a polystyrene-block-polyethylene oxide copolymer having a composition that yields spherical domains of PS in a PEO matrix is spin-cast onto cleaned silicon substrates from a solution containing a small amount of p-toluene sulfonic acid (PTSA) and water. After drying, the film is annealed at a temperature above the melting point of the PEO domain. The film is then placed into a high-pressure reactor similar to that described in Example 1. The reactor is sealed and the film is exposed to a 0.1 percent solution of MTES in humidified $CO_2$ at 60° C. and 125 bar for 3 hours. The reactor is then slowly vented to atmospheric pressure. The composite film is then removed from the reactor. The polymer template is then removed by calcination at 400° C. in an oven.

Example 17

Porous Silicate Films Produced Using Homopolymer Template with Inherent Acidic Groups A Silicon substrate (1.75 inch×1.75 inch) was cleaned using the procedure described in Example 1. A thin film of poly(methacrylic acid) was then spin-cast using a five wt. percent solution of poly(methacrylic acid) in water. After drying, a thin film of poly(methacrylic acid) was ~1700 Angstroms thick. The substrate with the spin-cast film was then placed into a high-pressure reactor, as described in Example 1. The reactor was sealed and the film was exposed to a specific amount (10 μl) of TEOS in humidified carbon dioxide at 60° C. and 122 bar for 2 hours using a high pressure syringe pump (ISCO, Inc) that was maintained at 60° C. using a constant temperature bath. The reactor was then slowly vented to atmospheric pressure. The composite film was then removed from the reactor and weighed. The mass of the film increased by 166 percent following the reaction. The composite film was then placed in an oven and then calcined at 400° C. in air using the procedure described in Example 1 in order to remove the polymer template. The calcined sample was then analyzed using Variable Angle Spectroscopic Ellipsometry (VASE). The film has a thickness of ~1395 Angstroms and a refractive index (μ) of ~1.19. The refractive index of the calcined film is much less than that of fumed silica (μ~1.45) indicating the porosity in the silicate film due to the poly(methacrylic acid) template.

Example 18

Porous Silicate Films Produced Using Block Copolymer Template with Inherent Acidic Groups A Silicon substrate (1.75 inch×1.75 inch) is cleaned using the procedure described in Example 1. A thin film of poly (styrene)-block-poly(acrylic acid) is then spin-cast using a solution in a suitable solvent. After drying, the substrate with the spin-cast film is then placed into a high-pressure reactor, as described in Example 1. The reactor is sealed and the film is exposed to a specific amount of TEOS in humidified carbon dioxide at a suitable temperature and pressure for a suitable reaction time using a high pressure syringe pump (ISCO, Inc). The reactor is then slowly vented to atmospheric pressure. The composite film is then removed from the reactor and calcined using the procedure described in Example 1 to remove the polymer template to yield a porous silicate film.

Example 19

Using a Patterned Block Copolymer Template

A silicon wafer is cleaned as described in Example 1. A thin film of a polystyrene-block-polyethylene oxide copolymer having a composition that yields spherical domains of PS in a PEO matrix is spin-cast onto cleaned silicon substrates from a solution containing a small amount of p-toluene sulfonic acid (PTSA) and water. After drying, the film is annealed at a temperature above the melting point of the PEO domain. A suitable lithographic mask is placed onto the substrate supported block copolymer film. The film and mask are then exposed to ultraviolet radiation. The mask is removed and the low molecular decomposition products are extracted from the polymer films by solvent washing. The patterned film is then placed into a high-pressure reactor similar to that described in Example 1. The reactor is sealed and the film is exposed to a 0.1 percent solution of TEOS in humidified $CO_2$ at 60° C. and 125 bar for 3 hours. The reactor is then slowly vented to atmospheric pressure. The composite film is then removed from the reactor. The polymer template is then removed by calcination at 400° C. in an oven yielding a patterned, porous silica film.

Example 20

Using a Homopolymer Resist as Template

A silicon wafer is cleaned as described in Example 1. The wafer is then pre-treated by exposure to 1,1,1,3,3,3-hexamethydisilazane or by coating with an anti-reflective coating. A thin film of a poly(tert-butyl methacrylate) is then spin-cast onto the wafer from a solution containing a photoacid generator. The resist is then exposed using UV radiation through an appropriate mask. The resist is then developed using a suitable solvent, leaving patterned poly(methacrylic acid) on the wafer. The patterned film is then placed into a high-pressure reactor similar to that described in Example 1. The reactor is sealed and the film is exposed to a 0.1 percent solution of TEOS in humidified $CO_2$ at 60° C. and 125 bar for 3 hours. The reactor is then slowly vented to atmospheric pressure. The composite film is then removed from the reactor. The polymer template is then removed by calcination at 400° C. in an oven yielding a patterned, porous silica film on the wafer.

Example 21

Using a Patterned Negative Tone Block Copolymer Resist as Template

A silicon wafer is cleaned as described in Example 1. The wafer is then pre-treated by exposure to 1,1,1,3,3,3-hexamethydisilazane or by coating with an anti-reflective coating. A thin film of a negative tone block copolymer photoresist that yields a patterned block copolymer containing hydrophilic and hydrophobic domains. One suitable example is a poly (tetrahydropyranyl methacrylate-block-1H, 1H, perfluorooctyl methacrylate) resist developed by Ober and co-workers. (*Chem. Mater.*, 12, 45 (2000)). A poly(tetrahydropyranyl methacrylate-block-1H, 1H, perfluorooctyl methacrylate) copolymer is spin-cast onto the wafer from a solution containing a photoacid generator. The resist is then exposed using a 193-nm stepper and an appropriate mask. Upon exposure, the tetrahydropyranyl methacrylate block is deprotected yielding a poly(methacrylic acid-block-1H, 1H, perfluorooctyl methacrylate) copolymer. The resist is then developed using a suitable solvent, leaving the patterned poly(methacrylic acid-block-1H, 1H, perfluorooctyl methacrylate) copolymer on the wafer. The patterned film is then placed into a high-pressure reactor similar to that described in Example 1. The reactor is sealed and the film is exposed to a 0.1 percent solution of TEOS in humidified $CO_2$ at 60° C. and 125 bar for 3 hours. The reactor is then slowly vented to atmospheric pressure. The composite film is then removed from the reactor. The polymer template is then removed by calcination at 400° C. in an oven yielding a patterned, porous silica film on the wafer.

Example 22

Using an Oriented Template Produced Using a Neutral Surface

A silicon wafer substrate is cleaned as described in Example 1. A thin film of a random copolymer having hydrophobic and hydrophilic monomer units is spin-cast onto the substrate to produce a neutral surface for the block copolymer template. A block copolymer composed of the same monomers as used in the random copolymer having a composition that yields spherical domains of the hydrophobic block in a hydrophilic matrix is spin-cast onto the random copolymer film from a solution containing a small amount of p-toluene sulfonic acid (PTSA) and water. After drying, the film is annealed to promote copolymer order and orientation. The substrate-supported polymer film is then placed into a high-pressure reactor similar to that described in Example 1. The reactor is sealed and the film is exposed to a 0.1 percent solution of TEOS in humidified $CO_2$ at 60° C. and 125 bar for 3 hours. The reactor is then slowly vented to atmospheric pressure. The composite film is then removed from the reactor. The polymer template is then removed by calcination at 400° C. in an oven yielding a porous silica film with oriented cylindrical pores.

Example 23

Using an Oriented Template Produced with an Electric Field

A thin film of a block copolymer having a hydrophobic and hydrophilic segments with a composition that yields spherical domains of the hydrophobic block in a hydrophilic matrix is spin-cast from a solution containing a small amount of p-toluene sulfonic acid (PTSA) and water onto a substrate covered with a thin gold layer that serves as an electrode. After drying, the copolymer film is covered with a thin Kapton® sheet coated with aluminum that serves as a second electrode. The film is then annealed in the presence of an electric field to promote copolymer orientation. The upper electrode is removed and the substrate-supported polymer film is then placed into a high-pressure reactor similar to that described in Example 1. The reactor is sealed and the film is exposed to a 0.1 percent solution of TEOS in humidified $CO_2$ at 60° C. and 125 bar for 3 hours. The reactor is then slowly vented to atmospheric pressure. The composite film is then removed from the reactor. The polymer template is then removed by calcination at 400° C. in an oven yielding a porous silica film with oriented cylindrical pores.

OTHER EMBODIMENTS

It is to be understood that while the invention has been described in conjunction with the detailed description thereof, the foregoing description is intended to illustrate and not limit the scope of the invention, which is defined by the scope of the intended claims. Other aspects, advantages, and modifications are within the scope of the following claims.

What is claimed is:

1. A method for forming a mesoporous material, the method comprising:
   providing an article comprising a layer of a polymer disposed on a substrate, wherein the polymer includes domains having a mesoscale structure and the polymer comprises a plurality of phases, wherein one of the phases forms the domains having the mesoscale structure;
   permeating the polymer disposed on the substrate with a solution comprising a precursor;
   reacting the precursor to form a deposit within the polymer, wherein the precursor is a metal oxide precursor and the deposit has a mesoscale structure corresponding to the domains; and
   removing the polymer from the article to form the mesoporous material comprising the deposit.

2. The method of claim 1, further comprising forming the polymer layer.

3. The method of claim 2, wherein forming the polymer layer comprises disposing a precursor of the polymer layer onto a substrate.

4. The method of claim 3, wherein the polymer layer precursor comprises the polymer and a solvent.

5. The method of claim 3, wherein the substrate comprises silicon.

6. The method of claim 1, wherein the polymer is homogeneous.

7. The method of claim 1, wherein the polymer is inhomogeneous.

8. The method of claim 1, wherein the polymer comprises a homopolymer or a copolymer.

9. The method of claim 8, wherein the copolymer comprises a block copolymer.

10. The method of claim 1, wherein the polymer comprises a porogen.

11. The method of claim 1, wherein the polymer has a decomposition temperature lower than a decomposition temperature of the deposit.

12. The method of claim 1, wherein forming the polymer layer comprises ordering the polymer.

13. The method of claim 12, wherein the polymer is ordered by causing the domains in the polymer to self-assemble.

14. The method of claim 12, wherein ordering the polymer comprises applying an external field to the polymer.

15. The method of claim 14, wherein the external field is an electric field or a magnetic field.

16. The method of claim 14, wherein the external field is a flow field or a shear field.

17. The method of claim 1, wherein the metal oxide precursor comprises tetraethylorthosilicate.

18. The method of claim 1, wherein the precursor comprises an organotrialkoxysilane, a diorganodialkoxysilane, tetraethylorthosilicate, methyltriethoxysilane, a bridged silsesquioxane, a halosilane, an alkoxysilane, an alkyl silsesquioxanes or an aryl silsesquioxane.

19. The method of claim 1, wherein the precursor comprises a titanium alkoxide.

20. The method of claim 1, further comprising providing a reaction reagent within the polymer to promote the precursor reaction within the polymer layer.

21. The method of claim 20, wherein the polymer layer comprises a plurality of domains and the reaction reagent is preferentially sequestered within one of the domains.

22. The method of claim 20, wherein the reaction agent comprises water.

23. The method of claim 1, further comprising providing a catalyst within the polymer layer to promote the precursor reaction within the polymer.

24. The method of claim 23, wherein the catalyst comprises an acid or a photoacid generator.

25. The method of claim 1, further comprising heating the polymer to promote the precursor reaction within the polymer.

26. The method of claim 1, wherein the deposit and the polymer separate during the reaction.

27. The method of claim 1, wherein the deposit preferentially forms in the domains having the mesoscale structure.

28. The method of claim 1, wherein removing the polymer comprises decomposing the polymer.

29. The method of claim 28, wherein removing the polymer further comprises extracting the decomposed polymer.

30. The method of claim 28, wherein decomposing the polymer comprises heating the article, exposing the article to a solvent, or exposing the article to radiation.

31. The method of claim 1, further comprising patterning the polymer layer.

32. The method of claim 31, wherein patterning the polymer layer comprises selectively removing portions of the polymer.

33. The method of claim 32, wherein the portions of the polymer are removed prior to permeating the polymer layer with the precursor.

34. The method of claim 32, wherein the portions of the polymer are removed after permeating the polymer layer with the precursor.

35. The method of claim 32, wherein portions of the polymer are selectively removed using photolithography.

36. The method of claim 1, wherein the mesoporous material comprises pores having a characteristic dimension between about 5 Angstroms and about 2,500 Angstroms.

37. The method of claim 36, wherein the pores have orientational order or translational order.

38. The method of claim 1, wherein the mesoporous material has a dielectric constant less than 2.5.

39. The method of claim 1, wherein the mesoporous material has a hardness greater than 0.1 GPa.

40. The method of claim 1, wherein the mesoporous material has a refractive index less than 1.4.

41. The method of claim 1, wherein the mesoporous material is birefringent.

42. A method for forming a mesoporous material, the method comprising:
    forming a polymer layer, wherein forming the polymer layer comprises disposing a precursor of the polymer layer onto a substrate, wherein the substrate comprises silicon,
    providing an article comprising the layer of the polymer disposed on the substrate, wherein the polymer includes domains having a mesoscale structure;
    permeating the polymer disposed on the substrate with a solution comprising a precursor;
    reacting the precursor to form a deposit within the polymer, wherein the precursor is a metal oxide precursor and the deposit has a mesoscale structure corresponding to the domains; and
    removing the polymer from the article to form the mesoporous material comprising the deposit.

43. A method for forming a mesoporous material, the method comprising:
    providing an article comprising a layer of a polymer disposed on a substrate, wherein the polymer comprises a block copolymer and includes domains having a mesoscale structure polymer;
    permeating the polymer disposed on the substrate with a solution comprising a precursor;
    reacting the precursor to form a deposit within the polymer, wherein the precursor is a metal oxide precursor and the deposit has a mesoscale structure corresponding to the domains; and
    removing the polymer from the article to form the mesoporous material comprising the deposit.

44. A method for forming a mesoporous material, the method comprising:
    providing an article comprising a layer of a polymer disposed on a substrate, wherein the polymer comprises a copolymer and includes domains having a mesoscale structure polymer;
    permeating the polymer disposed on the substrate with a solution comprising a precursor;
    reacting the precursor to form a deposit within the polymer, wherein the precursor is a metal oxide precursor and the deposit has a mesoscale structure corresponding to the domains; and
    removing the polymer from the article to form the mesoporous material comprising the deposit.

45. A method for forming a mesoporous material, the method comprising:
    providing an article comprising a layer of a polymer disposed on a substrate, wherein the polymer includes domains having a mesoscale structure polymer;
    permeating the polymer disposed on the substrate with a solution comprising a precursor;
    providing a catalyst within the polymer layer to promote a precursor reaction within the polymer,
    reacting the precursor to form a deposit within the polymer, wherein the precursor is a metal oxide precursor and the deposit has a mesoscale structure corresponding to the domains; and
    removing the polymer from the article to form the mesoporous material comprising the deposit.

46. A method for forming a mesoporous material, the method comprising:

providing an article comprising a layer of a polymer disposed on a substrate, wherein the polymer includes domains having a mesoscale structure polymer;

permeating the polymer disposed on the substrate with a solution comprising a precursor;

heating the polymer to promote a precursor reaction within the polymer, reacting the precursor to form a deposit within the polymer, wherein the precursor is a metal oxide precursor and the deposit has a mesoscale structure corresponding to the domains; and removing the polymer from the article to form the mesoporous material comprising the deposit.

* * * * *

UNITED STATES PATENT AND TRADEMARK OFFICE
CERTIFICATE OF CORRECTION

PATENT NO. : 7,419,772 B2  Page 1 of 1
APPLICATION NO. : 10/301013
DATED : September 2, 2008
INVENTOR(S) : James J. Watkins It is certified that error appears in the above-identified patent and that said Letters Patent is hereby corrected as shown below:

<u>Title page</u>,
Item [56], REFERENCES CITED, Column 2 (Other Publications):

Line 2, change "Flims" to -- Films --.
Line 16, change "Wordl" to -- World --.
Line 19, change "Macromolecues," to -- Macromolecules --.
Line 20, after "Syntheses" insert -- of --.
Line 21, change "Lenths" to -- Lengths --.
Line 24, change "Organiometallic" to -- Organometallic --.
Line 28, change "Stucd" to -- Study --.
Line 38, change "ouy" to -- out --.
Line 39, change "databese" to -- database --.
Line 56, change "Depositon" to -- Deposition --.

Signed and Sealed this

Eleventh Day of November, 2008

JON W. DUDAS
*Director of the United States Patent and Trademark Office*